(12) United States Patent
Jung et al.

(10) Patent No.: US 12,021,032 B2
(45) Date of Patent: Jun. 25, 2024

(54) SEMICONDUCTOR PACKAGE HAVING AN INTERPOSER AND METHOD OF MANUFACTURING SEMICONDUCTOR PACKAGE

(71) Applicant: SAMSUNG ELECTRONICS CO., LTD., Suwon-si (KR)

(72) Inventors: Yanggyoo Jung, Gwangmyeong-si (KR); Jinhyun Kang, Cheongju-si (KR); Sungeun Kim, Asan-si (KR); Sangmin Yong, Chungcheongnam-do (KR); Seungkwan Ryu, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/326,325

(22) Filed: May 31, 2023

(65) Prior Publication Data

US 2023/0326862 A1 Oct. 12, 2023

Related U.S. Application Data

(63) Continuation of application No. 17/208,512, filed on Mar. 22, 2021, now Pat. No. 11,694,961.

(30) Foreign Application Priority Data

Jun. 10, 2020 (KR) .................. 10-2020-0070375

(51) Int. Cl.
*H01L 23/538* (2006.01)
*H01L 23/00* (2006.01)
(Continued)

(52) U.S. Cl.
CPC .... *H01L 23/5383* (2013.01); *H01L 23/49816* (2013.01); *H01L 24/16* (2013.01); *H01L 24/73* (2013.01); *H01L 25/0655* (2013.01); *H01L 24/32* (2013.01); *H01L 2224/16227* (2013.01); *H01L 2224/32225* (2013.01); *H01L 2224/73204* (2013.01); *H01L 2924/1517* (2013.01)

(58) Field of Classification Search
CPC ........... H01L 23/5383; H01L 23/49816; H01L 24/16
See application file for complete search history.

(56) References Cited

U.S. PATENT DOCUMENTS 9,082,776 B2 7/2015 Lu et al.
9,128,123 B2 9/2015 Liu et al.
(Continued)

*Primary Examiner* — Errol V Fernandes
(74) *Attorney, Agent, or Firm* — F. Chau & Associates, LLC

(57) ABSTRACT

A semiconductor package includes a package substrate. An interposer is disposed on the package substrate. The interposer includes a semiconductor substrate, a wiring layer disposed on an upper surface of the semiconductor substrate and having a plurality of wirings therein, redistribution wiring pads disposed on the wiring layer and electrically connected to the wirings, bonding pads disposed on the redistribution wiring pads, and an insulation layer pattern disposed on the wiring layer and exposing at least a portion of the bonding pad, and first and second semiconductor devices disposed on the interposer. The first and second semiconductor devices are spaced apart from each other and are electrically connected to each other by at least one of the wirings.

20 Claims, 22 Drawing Sheets

(51) Int. Cl.
*H01L 23/498* (2006.01)
*H01L 25/065* (2023.01)

(56) References Cited

U.S. PATENT DOCUMENTS

| | | |
|---|---|---|
| 9,142,690 B2 | 9/2015 | Tsai et al. |
| 9,768,138 B2 | 9/2017 | Shen et al. |
| 9,892,962 B2 | 2/2018 | Wu et al. |
| 2007/0082475 A1 | 4/2007 | Park |
| 2011/0210443 A1 | 9/2011 | Hart et al. |
| 2018/0350764 A1 | 12/2018 | Huang et al. |
| 2019/0273057 A1 | 9/2019 | Ogata |
| 2019/0319626 A1 | 10/2019 | Dabral et al. |
| 2020/0013740 A1 | 6/2020 | Bae et al. |
| 2021/0391265 A1 | 12/2021 | Jung et al. |

SEMICONDUCTOR PACKAGE HAVING AN INTERPOSER AND METHOD OF MANUFACTURING SEMICONDUCTOR PACKAGE

CROSS-REFERENCE TO RELATED APPLICATION

This application is a Continuation of co-pending U.S. patent application Ser. No. 17/208,512, filed on Mar. 22, 2021, which claims priority under 35 U.S.C. § 119 to Korean Patent Application No. 10-2020-0070375, filed on Jun. 10, 2020 in the Korean Intellectual Property Office (KIPO), the contents of which are herein incorporated by reference in their entirety.

TECHNICAL FIELD

The present disclosure relates to a semiconductor package and, more specifically, to a semiconductor package having an interposer and a method of manufacturing the semiconductor package.

DISCUSSION OF THE RELATED ART

Semiconductor packages often integrate multiple chips in a single structure. An electronic device, such as a memory device, utilizing such a package may be able to provide high bandwidth access but such a package might also tend to have a high density of interconnects. An extra substrate, such as a silicon interposer, may be used to accommodate the high density of interconnects. However, during a bonding process of the interposer on a module substrate, there may be a problem that contaminants remain on a surface of a bonding pad of the interposer corresponding to a chip pad.

SUMMARY

A semiconductor package includes a package substrate. An interposer is disposed on the package substrate. The interposer includes a semiconductor substrate, a wiring layer disposed on an upper surface of the semiconductor substrate and having a plurality of wirings disposed therein, redistribution wiring pads disposed on the wiring layer and electrically connected to the wirings, bonding pads disposed on the redistribution wiring pads respectively, and an insulation layer pattern disposed on the wiring layer and exposing at least a portion of the bonding pad. First and second semiconductor devices are disposed on the interposer, are spaced apart from each other, and are electrically connected to each other by at least one of the wirings.

A semiconductor package includes a package substrate. An interposer is disposed on the package substrate. First and second semiconductor devices are disposed on the interposer, are spaced apart from each other, and are electrically connected to each other by the interposer. The interposer includes a semiconductor substrate having a plurality of through electrodes penetrating therethrough, a wiring layer disposed on an upper surface of the semiconductor substrate and having a plurality of wirings electrically connected to the through electrodes, first redistribution wiring pads disposed on the wiring layer and electrically connected to the wirings, first bonding pads disposed on the first redistribution wiring pads respectively, an insulation layer pattern disposed on the wiring layer and exposing at least a portion of the first bonding pad, second redistribution wiring pads disposed on a lower surface of the semiconductor substrate and electrically connected to the through electrodes, and second bonding pads disposed on the second redistribution wiring pads respectively. A diameter of the second bonding pad is at least three times a diameter of the first bonding pad.

A semiconductor package includes a package substrate. An interposer is disposed on the package substrate. The interposer includes a semiconductor substrate, a wiring layer disposed on an upper surface of the semiconductor substrate and having a plurality of wirings therein, first redistribution wiring pads disposed on the wiring layer and electrically connected to the wirings, first bonding pads disposed on the first redistribution wiring pads respectively, an insulation layer pattern disposed on the wiring layer and exposing a middle portion of an upper surface of the first bonding pad, and second bonding pads disposed on a lower surface of the semiconductor substrate. First and second semiconductor devices are disposed on the interposer, are spaced apart from each other, and are electrically connected to each other by the interpose. A plurality of solder bumps is disposed between substrate pads of the package substrate and the second bonding pads of the interposer. A plurality of conductive bumps is disposed between the first bonding pads of the interposer and chip pads of the first and second semiconductor devices.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EXAMPLE EMBODIMENTS

Hereinafter, exemplary embodiments of the present disclosure will be explained in detail with reference to the accompanying drawings.

Figure 1:
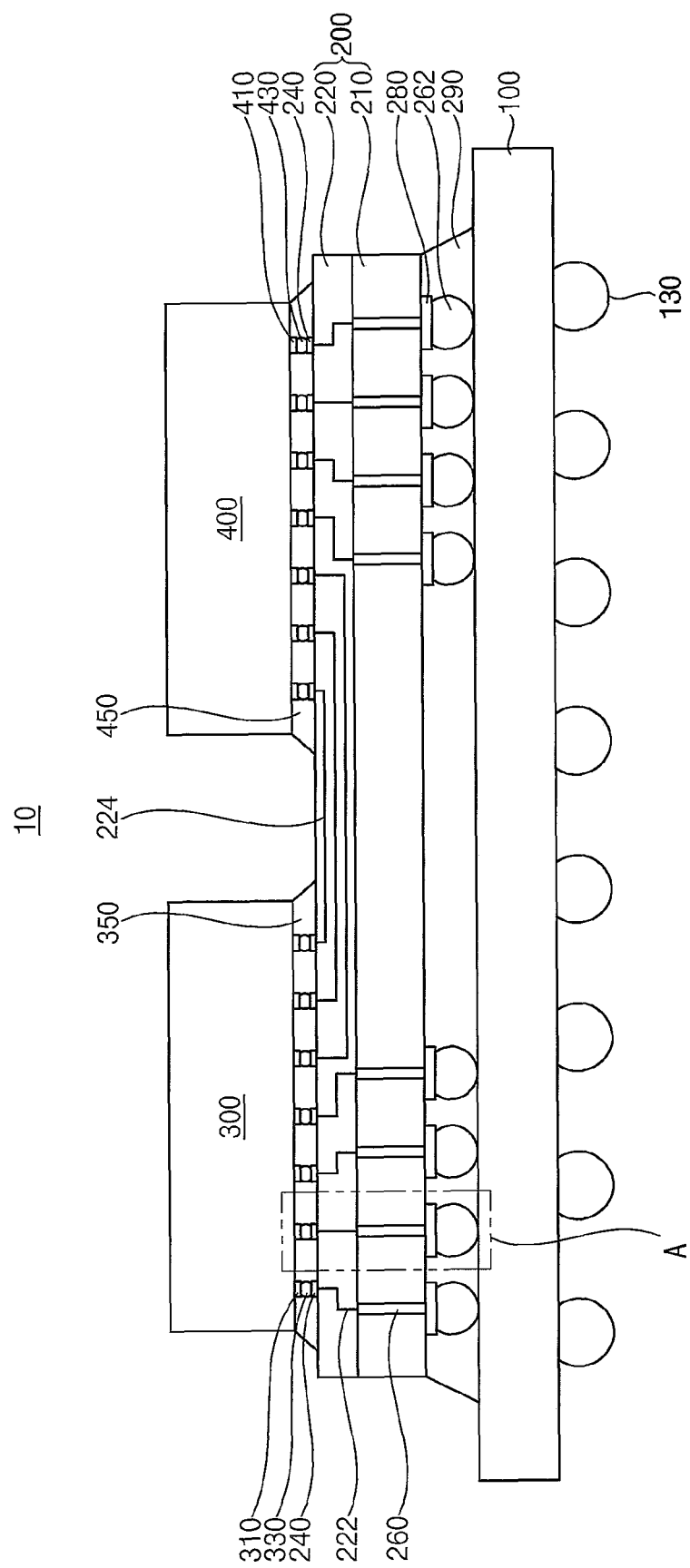
FIG. 1 is a cross-sectional view illustrating a semiconductor package in accordance with exemplary embodiments of the present disclosure.
Figure 2:
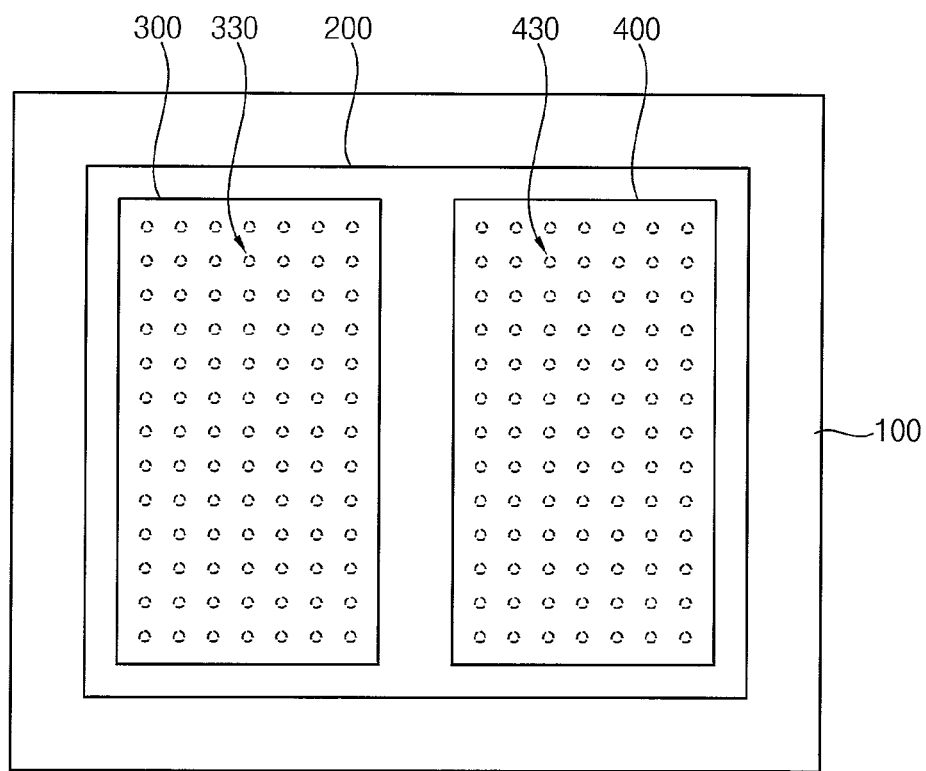
FIG. 2 is a plan view illustrating the semiconductor package in FIG. 1.
Figure 3:
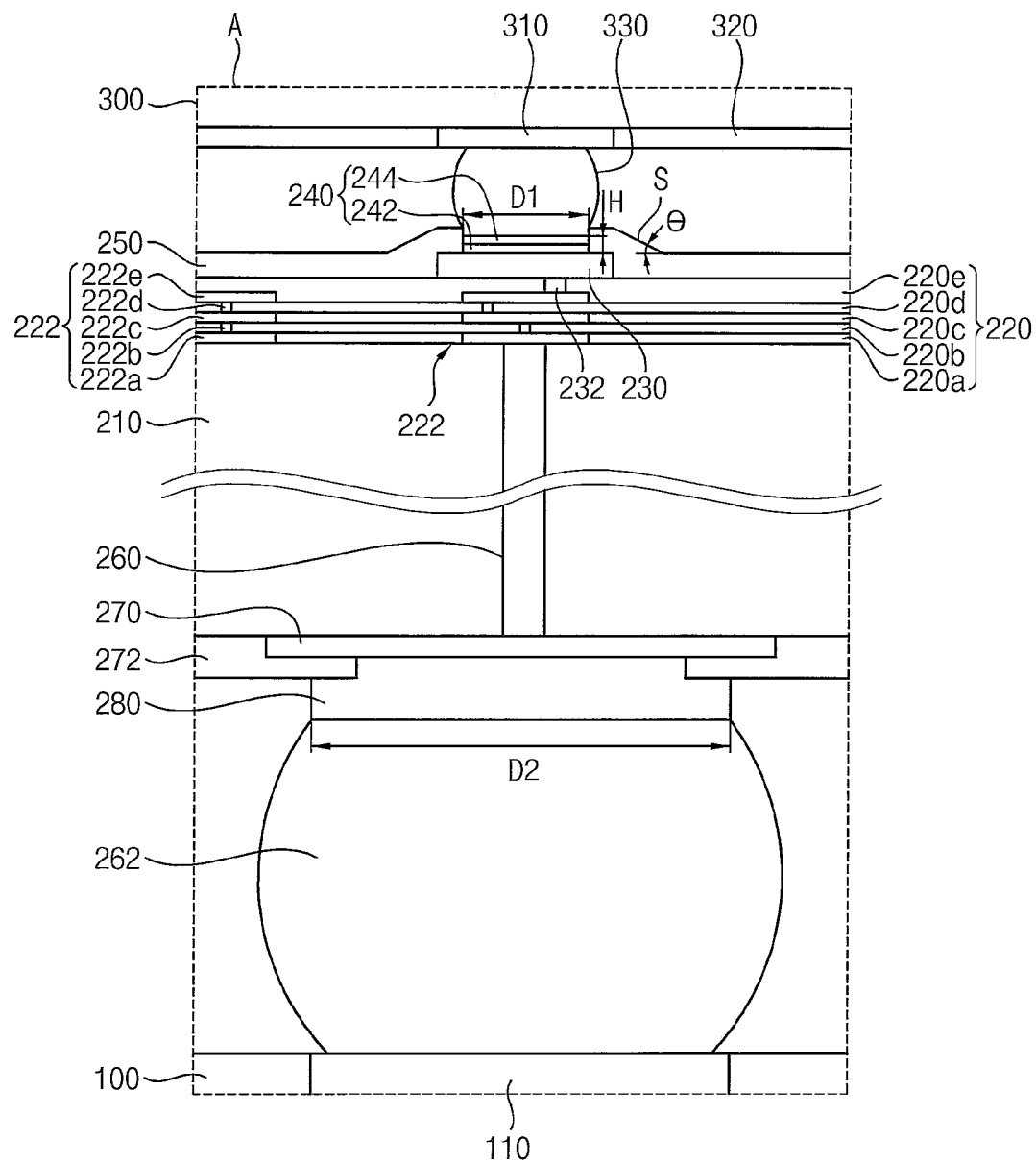
FIG. 3 is an enlarged cross-sectional view illustrating portion 'A' in FIG. 1.

FIG. 1 is a cross-sectional view illustrating a semiconductor package in accordance with exemplary embodiments of the present disclosure. FIG. 2 is a plan view illustrating the semiconductor package in FIG. 1. FIG. 3 is an enlarged cross-sectional view illustrating portion 'A' in FIG. 1.

Referring to FIGS. 1 to 3, a semiconductor package 10 may include a package substrate 100, an interposer 200, a first semiconductor device 300 and a second semiconductor device 400.

In exemplary embodiments of the present disclosure, the semiconductor package 10 may be a memory device having a structure in which a plurality of dies (chips) are disposed. For example, the semiconductor package 10 may include a semiconductor memory device with a 2.5D chip structure. A 2.5D (two and a half dimension) structure combines multiple integrated circuit dies in a single package without vertical stacking, as is done in a 3D chip package. In this case, the first semiconductor device 300 may include a logic semiconductor device, and the second semiconductor device 400 may include a memory device. The logic semiconductor device may include a central processing unit (CPU), a graphical processing unit (GPU), an application-specific integrated circuit (ASIC), or a system-on-chip (SOC). The memory device may include a high bandwidth memory (HBM) device.

Alternatively, the semiconductor package 10 may include a semiconductor memory device with a 3D chip structure. In this case, the semiconductor package 10 may include a first semiconductor device and a second semiconductor device sequentially and vertically stacked on the package substrate 100. A pad structure formed on an upper surface of the first semiconductor device may be substantially the same as or similar to a pad structure of the interposer 200.

In exemplary embodiments of the present disclosure, the package substrate 100 may have an upper surface (facing the interposer 200) and a lower surface opposite to the upper surface. For example, the package substrate 100 may be a printed circuit board (PCB). The PCB may be a multilayered circuit board including vias and various circuits disposed therein.

The interposer 200 may be disposed on the upper surface of the package substrate 100. A planar area of the interposer 200 may be less than a planar area of the package substrate 100. The interposer 200 may be disposed within the area of the package substrate 100 in plan view. For example, the package substrate 100 may overhang the interposer 200 with the interposer 200 not overhanging the package substrate 100.

The interposer 200 may be a silicon interposer including a plurality of connecting wirings disposed therein. The first semiconductor device 300 and the second semiconductor device 400 may be connected to each other through the wirings and may be electrically connected to the package substrate 100 through solder bumps 262. The silicon interposer 200 may provide a high density interconnection between the first and second semiconductor devices 300 and 400.

In exemplary embodiments of the present disclosure, the interposer 200 may include a semiconductor substrate 210, a wiring layer 220 including a plurality of wirings disposed on an upper surface of the semiconductor substrate 210, a plurality of pad structures disposed on the wiring layer 220 and having a plurality of first bonding pads 240, and a plurality of second bonding pads 280 disposed on a lower surface (facing the substrate 100) of the semiconductor substrate 210.

For example, the interposer 200 may have an area of 20 mm×30 mm or more. The substrate 210 may include silicon, germanium, silicon-germanium, and/or III-V compounds, e.g., GaP, GaAs, GaSb, etc. In some embodiments, the substrate 210 may be a silicon-on-insulator (SOI) substrate, or a germanium-on-insulator (GOI) substrate.

The wiring layer 220 may include a plurality of insulation layers 220a, 220b, 220c, 220d, 220e and a plurality of wirings 222, 224 in the insulation layers. The wirings may include first wirings 222 and second wirings 224.

The first wiring 222 may include a first metal wiring 222a, a first contact 222b, a second metal wiring 222c, a second contact 222d and a third metal wiring 222e respectively disposed in the insulation layers 220a, 220b, 220c, 220d, 220e of the wiring layer 220. Similarly, the second wiring 224 may include at least one of the metal wirings and the contacts respectively disposed in the insulation layers. For example, the first and second wirings may include a metal such as copper (Cu).

The substrate 210 may include a plurality of through electrodes 260 penetrating therethrough. The through electrode 260 may include a through silicon via. The through electrode 260 may extend in a thickness direction from a first surface of the semiconductor substrate 210. An end portion of the through electrode 260 may contact the first metal wiring 222a of the wiring layer 220.

In exemplary embodiments of the present disclosure, the pad structure may include first redistribution wiring pads 230 disposed on the wiring layer 220 and electrically connected to the wirings, the first bonding pad 240 on each of the first redistribution wiring pads 230 and a first insulation layer pattern 250 disposed on the wiring layer 220 and exposing at least a portion of the first bonding pad 240.

The first redistribution wiring pad 230 may be disposed on the wiring layer 220. The first redistribution wiring pad 230 may be electrically connected to the uppermost third metal wiring 222e through a via 232. For example, the first redistribution wiring pad 230 and the via 232 may include a metal such as aluminum (Al).

The first insulation layer pattern 250 may be disposed on the wiring layer 220 and may expose a portion of the first redistribution wiring pad 230. The first insulation layer pattern 250 may have a first opening exposing a middle portion of the first redistribution wiring pad 230. The first insulation layer pattern 250 may extend from the wiring layer 220 to a peripheral region of the first redistribution wiring pad 230.

The first insulation layer pattern 250 may have a first inclined surface S extending downward in an outward direction from a periphery of the first redistribution wiring pad 230. The first inclined surface S may be arranged adjacent to an upper outer portion of the first redistribution wiring pad 230. The first inclined surface S may extend at an angle θ with respect to the surface of the wiring layer 220. For example, the angle of the first inclined surface S may be within a range of 40 degrees to 60 degrees with respect to the surface of the wiring layer 220.

For example, the first insulation layer pattern 250 may include an oxide, a nitride, etc. Alternatively, the first insulation layer pattern 250 may include a polymer such as a redistribution layer (RDL) buffered coating layer (RBC).

The first bonding pad 240 may be disposed on the first redistribution wiring pad 230. The first bonding pad 240 may be arranged on an upper surface of the first redistribution wiring pad 230. The first bonding pad 240 may be arranged within the first opening of the first insulation layer pattern 250. A height of the first bonding pad 240 may be less than a height of the first insulation layer pattern 250. For example, the first bonding pad 240 may have a height H of 2 μm or less. The first bonding pad 240 may have a diameter of 20 μm to 30 μm.

The first bonding pad 240 may include a seed layer pattern 242 formed on the first redistribution wiring pad 230 within the first opening 251 of the first insulation layer pattern 250 and a plating layer pattern 244 formed on the seed layer pattern 242.

The seed layer pattern 242 may include an alloy layer including titanium/copper (Ti/Cu), titanium/palladium (Ti/Pd), titanium/nickel (Ti/Ni), chromium/copper (Cr/Cu) or a combination thereof.

The plating layer pattern 244 may be a surface treated layer formed on the first redistribution wiring pad 230. The plating layer pattern may include a conductive material such as copper (Cu), aluminum (Al), silver (Ag), tin (Sn), gold (Au), nickel (Ni), lead (Pb), titanium (Ti) or alloys thereof. The plating layer pattern may include a plurality of plating layers. For example, the plating layer pattern may include a first plating layer pattern and a second plating layer pattern on the first plating layer pattern. The first plating layer pattern may include nickel (Ni) and the second plating layer pattern may include gold (Au).

In exemplary embodiments of the present disclosure, a second redistribution wiring pad 270 may be disposed on the lower surface of the semiconductor substrate 210 and may be electrically connected to the through electrode 260. A second insulation layer pattern 272 may be formed on the second surface 214 of the substrate 210 and may expose a portion of the second redistribution wiring pad 270. For example, the second insulation layer pattern 272 may include oxide, nitride, etc. Alternatively, the second insulation layer pattern 272 may include a polymer such as RDL buffered coating layer (RBC).

The second bonding pad 280 may be disposed on the second redistribution wiring pad 270. For example, the second bonding pad 280 may have a diameter of 70 μm to 80 μm. The diameter of the second bonding pad 280 may be at least three times as large as the diameter of the first bonding pad 240.

The interposer 200 may be mounted on the package substrate 100 via the solder bumps 262. The solder bump 262 may be formed on the second bonding pad 280. For example, the solder bump 262 may include C4 bump. The second bonding pad 280 of the interposer 200 may be electrically connected to a substrate pad 110 of the package substrate 100 by the solder bump 262.

In exemplary embodiments of the present disclosure, the first semiconductor device 300 may be arranged on the interposer 200. The first semiconductor device 300 may be mounted on the interposer 200 in a flip chip boding manner. In this case, the first semiconductor device 300 may be mounted such that an active surface of the first semiconductor device 300 on which chip pads 310 are formed face the interposer 200. The chip pads 310 of the first semiconductor device 300 may be electrically connected to the first bonding pads 240 of the interposer 200 by conductive bumps 330. For example, the conductive bumps 330 may include microbumps (μbumps).

The second semiconductor device 400 may be arranged on the interposer 200 and may be spaced apart from the first semiconductor device 300. The second semiconductor device 400 may be mounted on the interposer 200 in a flip chip boding manner. In this case, the second semiconductor device 400 may be mounted such that an active surface of the second semiconductor device 400 on which chip pads 410 are formed faces the interposer 200. The chip pads 410 of the second semiconductor device 400 may be electrically connected to the first bonding pads 240 of the interposer 200 by conductive bumps 430. For example, the conductive bumps 430 may include microbumps (μbumps).

Although only one first semiconductor device 300 and one second semiconductor device 400 are illustrated in the figures, the numbers and arrangements thereof are exemplary, and the present invention is not limited thereto. For example, the second semiconductor device 400 may include a buffer die and a plurality of memory dies (chips) sequentially and vertically stacked on the buffer die. The buffer die and the memory dies may be electrically connected to each other by through silicon vias (TSVs).

The first wirings 222 may be electrically connected to through electrodes 260. The first and second semiconductor devices 300, 400 may be electrically connected to the package substrate 100 through the first wirings 222 and the through electrodes 260. The first semiconductor device 300 and the second semiconductor device 400 may be electrically connected to each other by the second wirings 224.

In exemplary embodiments of the present disclosure, the semiconductor package 10 may further include a first adhesive 290 underfilled disposed between the interposer 200 and the package substrate 100, a second adhesive 350 underfilled disposed between the first semiconductor device 300 and the interposer 200, and a third adhesive 450 underfilled disposed between the second semiconductor device 400 and the interposer 200.

For example, the first, second and third adhesives 250, 350, 450 may include an epoxy material and may reinforce a gap between the package substrate 100 and the interposer 200 and a gap between each of the first and second semiconductor devices 300 and 400 and the interposer 200.

Outer connection pads may be formed on the lower surface of the package substrate 100, and outer connection members 130 for an electrical connection with an external device may be disposed on the outer connection pads. The outer connection members 130 may be, for example, solder balls. The semiconductor package 10 may be mounted on a module substrate by the solder balls, thus constituting a memory module.

A molding member may be formed on the interposer 200 and may cover the first semiconductor device 300 and the second semiconductor device 400. The molding member may include epoxy mold compound (EMC).

Although only some substrate pads, the first bonding pads and the second bonding pads are illustrated in the figures, the present invention is not limited to the numbers and arrangements of the substrate pads shown.

As mentioned above, the semiconductor package 10 may include the pad structure formed on the wiring layer 220 of the interposer 200. The pad structure may include the first bonding pad 240 arranged within the first opening of the first insulation layer pattern 250. The height of the first bonding pad 240 may be less than the height of the first insulation layer pattern 250. The first insulation layer pattern 250 may have the first inclined surface S extending downward in the outward direction from the periphery of the first redistribution wiring pad 230.

Thus, since the pad structure has an intaglio structure, contamination may be prevented from remaining on the pad structure during a bonding process of the interposer, as described later.

Hereinafter, a method of manufacturing the semiconductor package in FIG. 1 will be explained.

Figure 4:
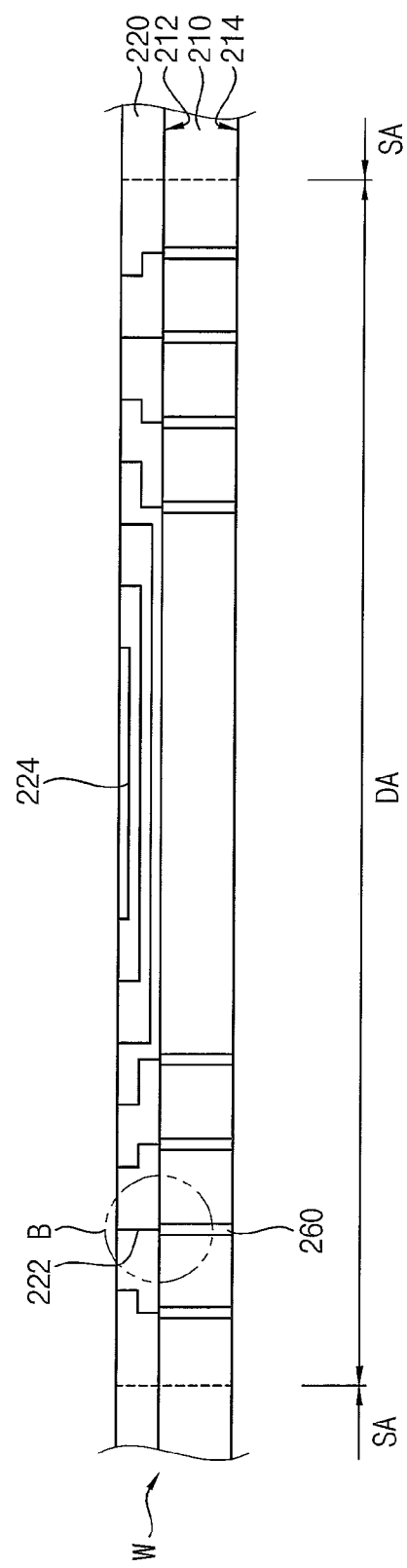
FIGS. 4 to 15 are cross-sectional views illustrating a method of manufacturing a semiconductor package in accordance with exemplary embodiments of the present disclosure.
Figure 5:
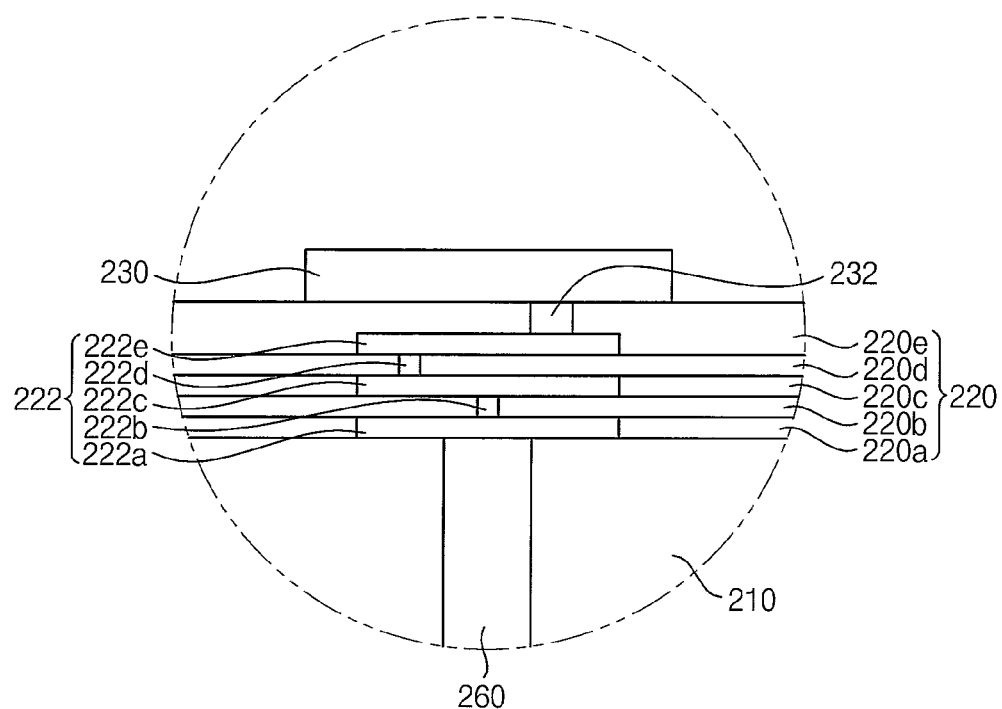
Figure 6:
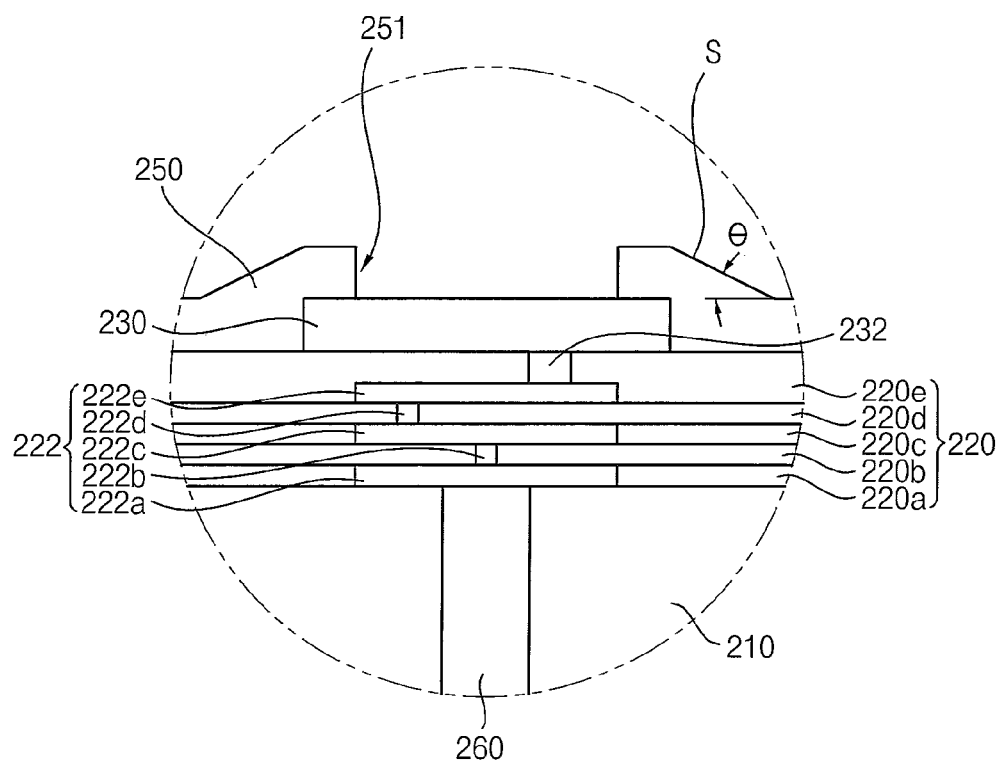
Figure 7:
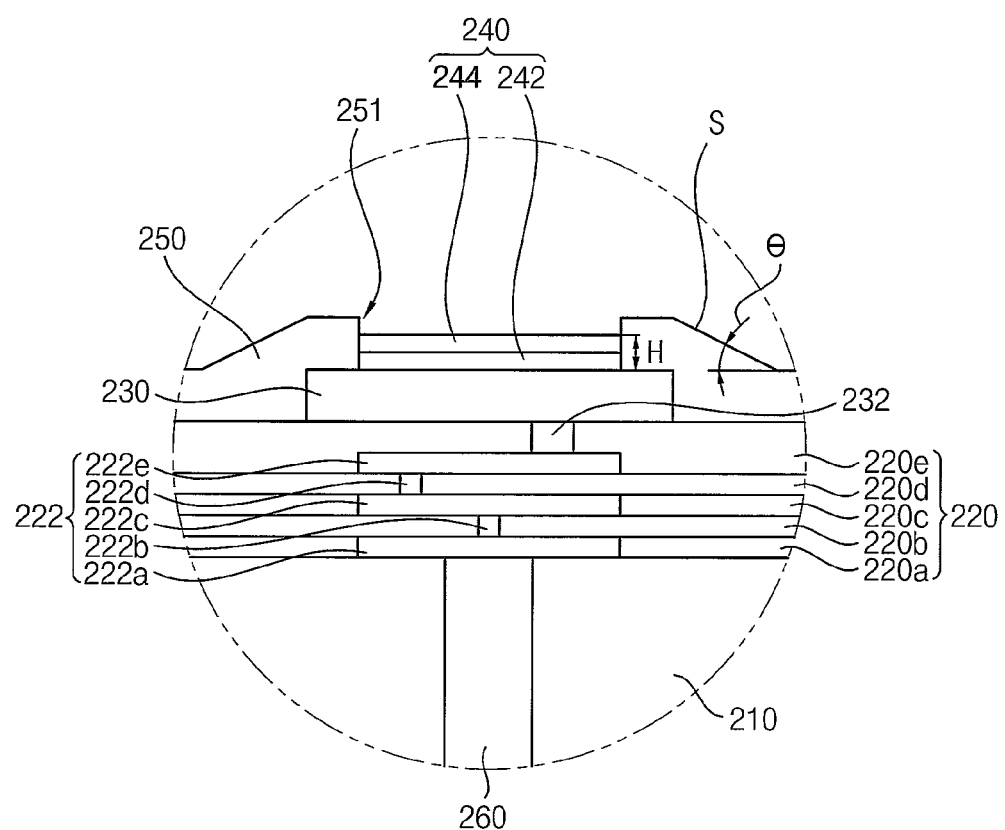
Figure 8:
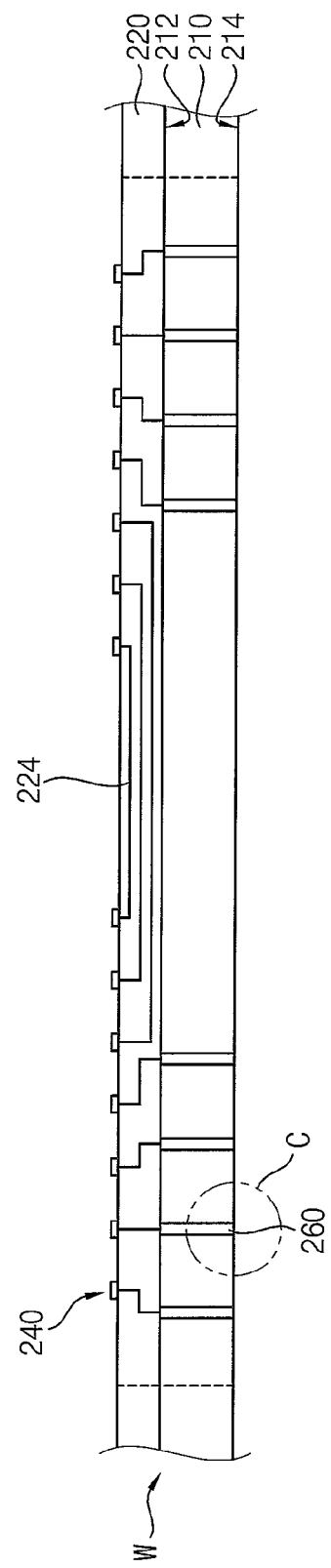
Figure 9:
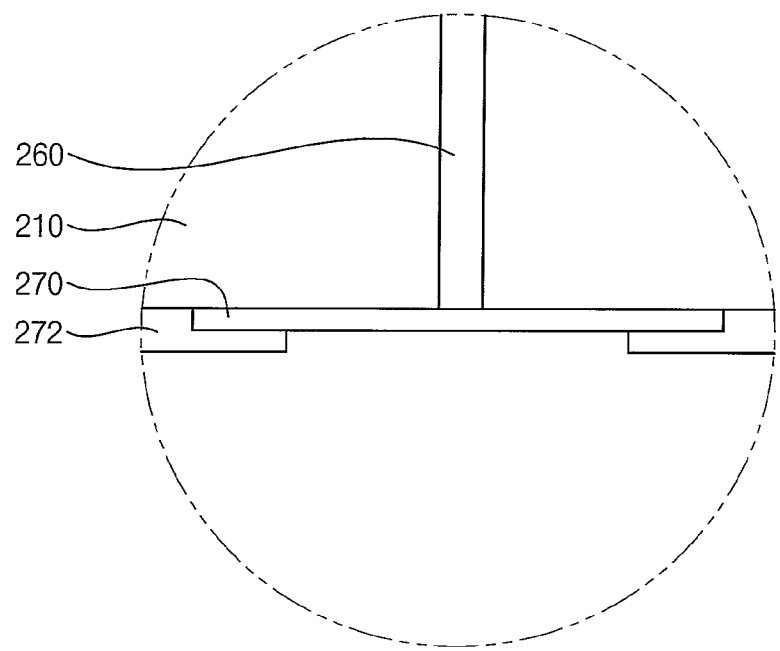
Figure 10:
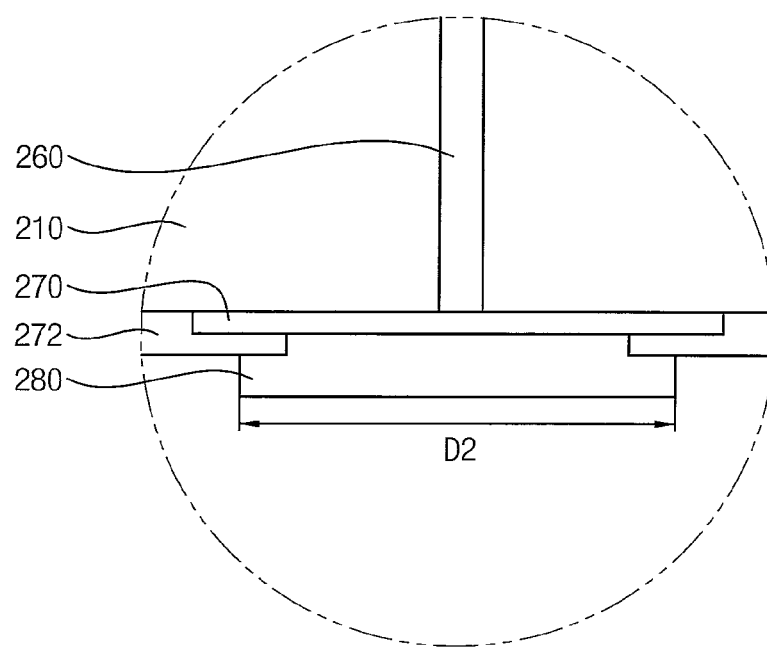

FIGS. 4 to 15 are cross-sectional views illustrating a method of manufacturing a semiconductor package in accordance with exemplary embodiments of the present disclosure. FIGS. 5 to 7 are enlarged cross-sectional views illustrating portion 'B' in FIG. 4. FIGS. 9 and 10 are enlarged cross-sectional views illustrating portion 'C' in FIG. 8.

Referring to FIGS. 4 to 8, first, pad structures for adjoining with conductive bumps may be formed on a surface of a wafer W.

In exemplary embodiments of the present disclosure, the wafer W may include a substrate 210 and a wiring layer 220. The wiring layer 220 may be disposed on a first surface 212 of the substrate 210. The wafer W may include a mounting region DA where semiconductor device(s) are mounted and a scribe lane region SA at least partially surrounding the mounting region DA. As described later, the wafer W may be sawed or otherwise cut along the scribe lane region SA dividing the mounting region DA to form an individual interposer. For example, the mounting region DA may have an area of 20 mm×30 mm or more.

For example, the substrate 210 may include silicon, germanium, silicon-germanium, or III-V compounds, e.g., GaP, GaAs, GaSb, etc. In some embodiments, the substrate 210 may be a silicon-on-insulator (SOI) substrate, or a germanium-on-insulator (GOI) substrate.

The wiring layer 220 may be formed on the first surface 212 of the substrate 210. The wiring layer 220 may be formed by a back process referred to as BEOL (Back End of Line) process.

The wiring layer 220 may include a plurality of insulation layers 220*a*, 220*b*, 220*c*, 220*d*, 220*e* and a plurality of wirings 222, 224 in the insulation layers. The wirings may include first wirings 222 and second wirings 224.

The first wiring 222 may include a first metal wiring 222*a*, a first contact 222*b*, a second metal wiring 222*c*, a second contact 222*d* and a third metal wiring 222*e* respectively disposed in the insulation layers 220*a*, 220*b*, 220*c*, 220*d*, 220*e*. Similarly, the second wiring 224 may include at least one of the metal wirings and the contacts respectively disposed in the insulation layers. For example, the first and second wirings may include a metal such as copper (Cu).

The substrate 210 may include a plurality of through electrodes (through silicon vias) 260 which are formed to penetrate through the substrate. The through electrodes 260 may be electrically connected to the first wirings 222 respectively. The through electrode 260 may be formed before grinding a backside of the substrate 210, which may be a second surface 214.

In exemplary embodiments of the present disclosure, the pad structures may be formed on the wiring layer 220.

Firstly, as illustrated in FIG. 5, a first redistribution wiring pad 230 may be formed on the wiring layer 220. The first redistribution wiring pad 230 may be formed by a redistribution wiring process. The first redistribution wiring pad 230 may be electrically connected to the uppermost third metal wiring 222*e* through a via 232. For example, the first redistribution wiring pad 230 and the via 232 may include a metal such as aluminum (Al).

As illustrated in FIG. 6, a first insulation layer pattern 250 may be formed on the wiring layer 220 and may expose a portion of the first redistribution wiring pad 230. The first insulation layer pattern 250 may have a first opening 251 exposing a middle portion of the first redistribution wiring pad 230. The first insulation layer pattern 250 may extend from the wiring layer 220 to a peripheral region of the first redistribution wiring pad 230. For example, the first opening 251 may have a diameter of 20 μm to 30 μm.

The first insulation layer pattern 250 may have a first inclined surface S extending downward in an outward direction from a periphery of the first redistribution wiring pad 230. The first inclined surface S may be arranged adjacent to an upper outer portion of the first redistribution wiring pad 230. The first inclined surface S may extend at an angle θ with respect to the surface of the wiring layer 220. For example, the angle of the first inclined surface S may be within a range of 40 degrees to 60 degrees with respect to the surface of the wiring layer 220.

For example, the first insulation layer pattern 250 may include oxide, nitride, etc. Alternatively, the first insulation layer pattern 250 may include a polymer such as RDL buffered coating layer (RBC). Additionally, the first insulation layer pattern 250 may be formed by a chemical vapor deposition (CVD) process, a plasma enhanced chemical vapor deposition (PECVD) process, an atomic layer deposition (ALD) process, a lower pressure chemical vapor deposition (LPCVD) process, a sputtering process, etc. Alternatively, the first insulation layer pattern 250 may include a polymer layer formed by a spin coating process or a spray process.

As illustrated in FIG. 7, a first bonding pad 240 may be formed on the first redistribution wiring pad 230. The first bonding pad 240 may be arranged exclusively on an upper surface of the first redistribution wiring pad 230. The first bonding pad 240 may be arranged within the first opening 251 of the first insulation layer pattern 250. A height of the first bonding pad 240 may be less than a height of the first insulation layer pattern 250. For example, the first bonding pad 240 may have a height H of 2 μm or less. The first bonding pad 240 may have a diameter of 20 μm to 30 μm.

For example, the first bonding pad 240 may include a seed layer pattern 242 formed on the first redistribution wiring pad 230 within the first opening 251 of the first insulation layer pattern 250 and a plating layer pattern 244 formed on the seed layer pattern 242.

The seed layer pattern 242 may include an alloy layer including titanium/copper (Ti/Cu), titanium/palladium (Ti/Pd), titanium/nickel (Ti/Ni), chromium/copper (Cr/Cu) or a combination thereof. The seed layer pattern 242 may be formed by a sputtering process.

The plating layer pattern 244 may be formed by forming a photoresist layer covering the first insulation layer pattern 250, performing an exposure process on the photoresist layer to form a photoresist pattern having an opening exposing the seed layer pattern 242 and performing a plating process on the seed layer pattern 242.

The plating layer pattern may be a surface treated layer formed on the first redistribution wiring pad 230. The plating layer pattern may include a conductive material such as copper (Cu), aluminum (Al), silver (Ag), tin (Sn), gold (Au), nickel (Ni), lead (Pb), titanium (Ti) or alloys thereof. The plating layer pattern may include a plurality of plating layers. For example, the plating layer pattern may include a first plating layer pattern and a second plating layer pattern on the first plating layer pattern. The first plating layer pattern may include nickel (Ni) and the second plating layer pattern may include gold (Au).

As mentioned above, the pad structure formed on the wiring layer 220 may include the first bonding pad 240 arranged within the first opening 251 of the first insulation layer pattern 250. The height of the first bonding pad 240 may be less than the height of the first insulation layer pattern 250. The first insulation layer pattern 250 may have the first inclined surface S extending downward in an outward direction from a periphery of the first redistribution wiring pad 230.

Thus, since the pad structure has an intaglio structure, contamination may be prevented from remaining on the pad structure during a bonding process of the interposer, as described later.

Referring to FIGS. 9 to 13, solder bumps 262 may be formed on the second surface 214 of the substrate 210 and the wafer W may be sawed or otherwise cut to form the interposer 200.

Figure 11:
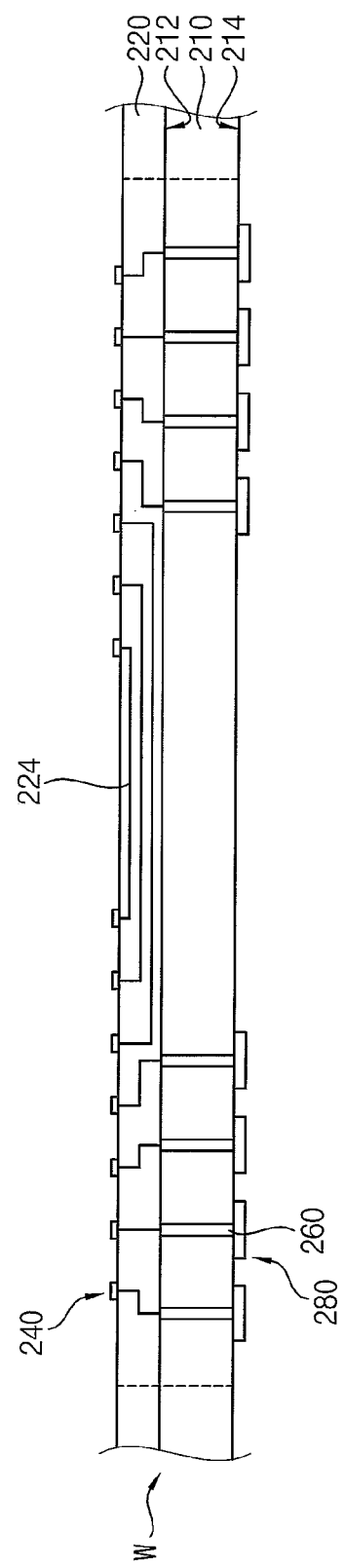

As illustrated in FIGS. 9 to 11, a second redistribution wiring pad 270, a second insulation layer pattern 272 and a second bonding pad 280 may be formed on the second surface 214 of the substrate 210.

The second redistribution wiring pad 270 may be electrically connected to the through electrode 260. The second insulation layer pattern 272 may be formed on the second surface 214 of the substrate 210 and may expose a portion of the second redistribution wiring pad 270. For example, the second insulation layer pattern 272 may include oxide, nitride, etc. Alternatively, the second insulation layer pattern 272 may include a polymer such as RDL buffered coating layer (RBC).

The second bonding pad 280 may be formed on the second redistribution wiring pad 270. The second bonding pad 280 may be formed by forming a seed layer and a photoresist layer on the second insulation layer pattern 272 on the second surface 214 of the substrate 210, performing an exposure process on the photoresist layer to form a photoresist pattern having an opening exposing the seed layer and performing a plating process on the seed layer.

For example, the second bonding pad 280 may have a diameter of 70 μm to 80 μm. The diameter of the second bonding pad 280 may be at least three times as large as the diameter of the first bonding pad 240.

Figure 12:
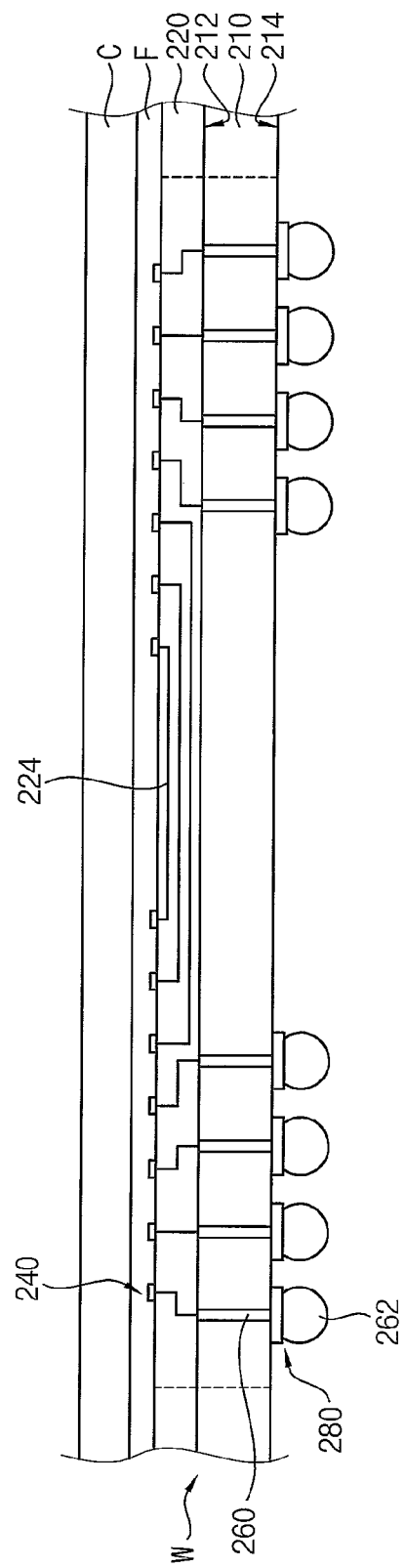
Figure 13:
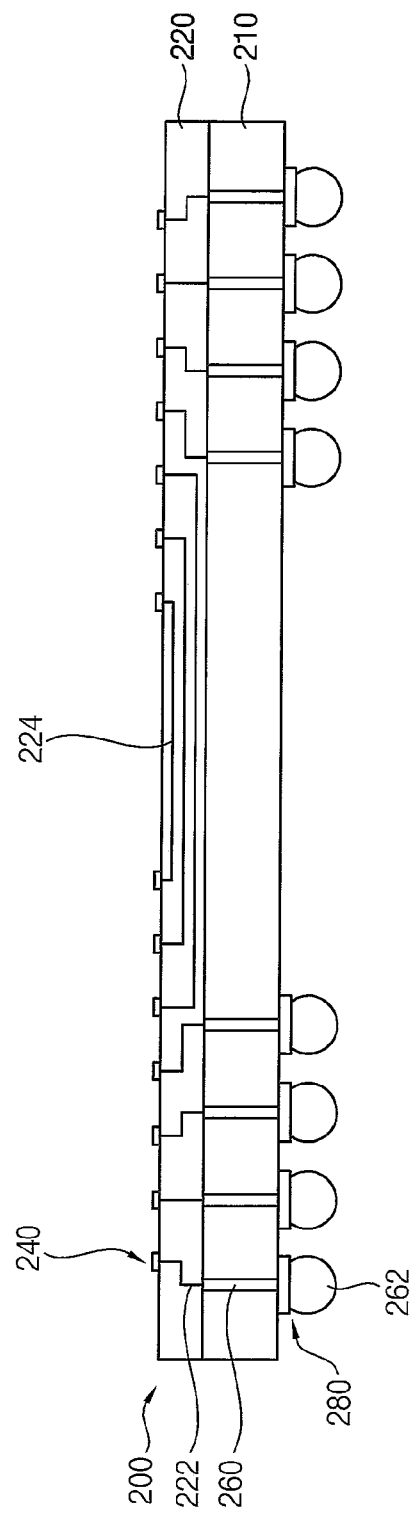

As illustrated in FIGS. 12 and 13, after the solder bumps 262 are formed on the second bonding pads 280, the wafer W may be sawed or otherwise cut along the scribe lane region SA to form the individual interposer 200. For example, the solder bump 262 may include C4 bump.

After the solder bumps 262 are adhered on the second bonding pads 280, the wafer W may be adhered on a ring frame C using an adhesive film F and then the wafer W may be cut by a sawing process. Here, the adhesive film F may be adhered on the pad structures on the wiring layer 220 of the wafer W. When the individual interposer 200 is removed from the adhesive film F, since the pad structure has the intaglio structure, contamination due to the adhesive film may be prevented from remaining on the pad structure.

Figure 14:
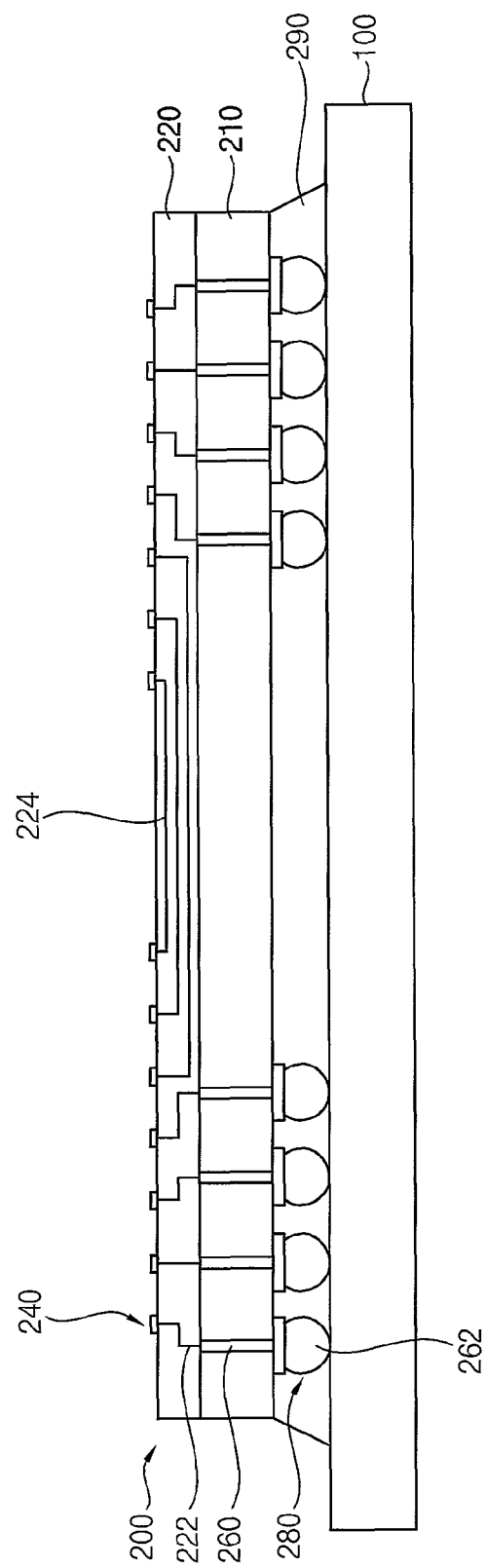

Referring to FIG. 14, the interposer 200 may be arranged on a package substrate 100.

In exemplary embodiments of the present disclosure, the interposer 200 may be mounted on the package substrate via the solder bumps 262. The interposer 200 may be adhered on the package substrate 100 by a thermal compression process.

In the thermal compression process, a pressing unit may press the surface of the interposer on which the pad structures are formed. Since the pad structure has the intaglio structure, contamination due to the pressing unit on the pad structure may be prevented.

Then, a first adhesive 290 may be underfilled between the interposer 200 and the package substrate 100. A planar area of the interposer 200 may be smaller than a planar area of the package substrate 100.

Figure 15:
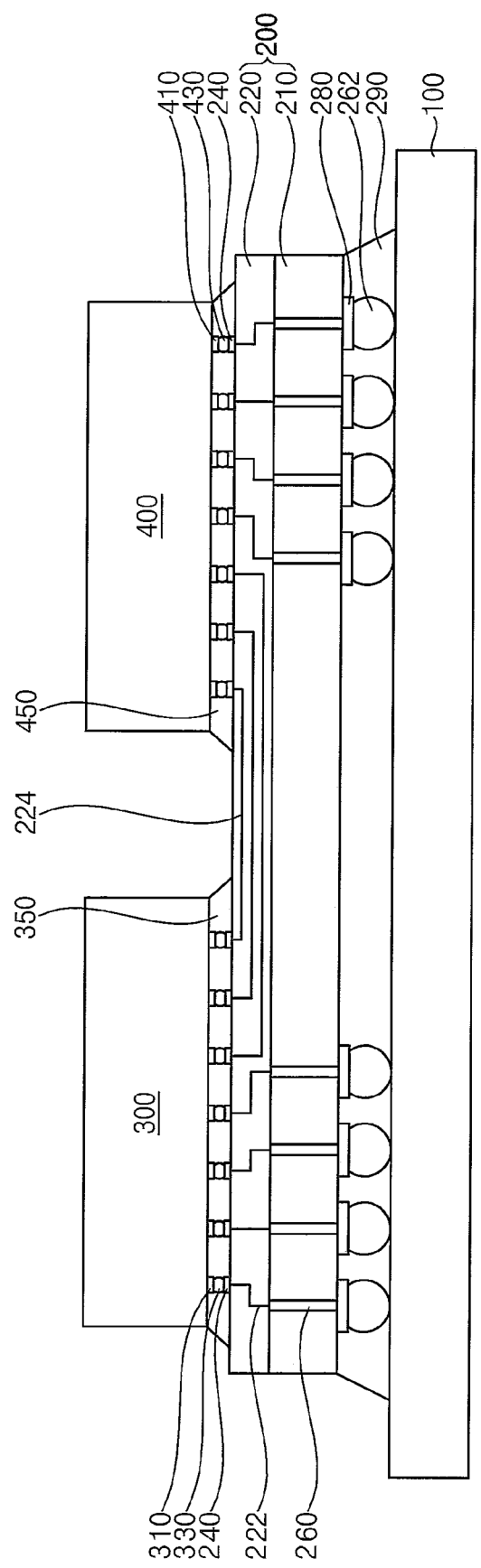

Referring to FIG. 15, a first semiconductor device 300 and a second semiconductor device 400 may be arranged on the interposer 200 and may be spaced apart from each other.

In exemplary embodiments of the present disclosure, the first and second semiconductor devices 300, 400 may be mounted on the interposer 200 in a flip chip boding manner. Chip pads 310 of the first semiconductor device 300 may be electrically connected to the first bonding pads 240 of the interposer 200 by conductive bumps 330. Chip pads 410 of the second semiconductor device 400 may be electrically connected to the first bonding pads 240 of the interposer 200 by conductive bumps 430. For example, the conductive bumps 330, 430 may include microbumps (μbumps).

For example, the first semiconductor device 300 may include a logic semiconductor device, and the second semiconductor device 400 may include a memory device. The logic semiconductor device may include a CPU, a GPU, an ASIC, or an SOC. The memory device may include a high bandwidth memory (HBM) device. In this case, the second semiconductor device 400 may include a buffer die and a plurality of memory dies (chips) sequentially stacked on the buffer die. The buffer die and the memory dies may be electrically connected to each other by through silicon vias.

Then, a second adhesive 350 may be underfilled between the first semiconductor device 300 and the interposer 200, and a third adhesive 450 may be underfilled between the second semiconductor device 400 and the interposer 200.

For example, the first, second and third adhesives 250, 350, 450 may include an epoxy material and may reinforce a gap between the package substrate 100 and the interposer 200 and a gap between each of the first and second semiconductor devices 300 and 400 and the interposer 200.

A molding member may be formed on the interposer 200 and may cover the first semiconductor device 300 and the second semiconductor device 400. The molding member may include epoxy mold compound (EMC).

As mentioned above, the pad structure may be formed on the wiring layer 220 and may have the intaglio structure. Thus, contamination may be prevented from remaining on the pad structure during the bonding process of the interposer.

Figure 16:
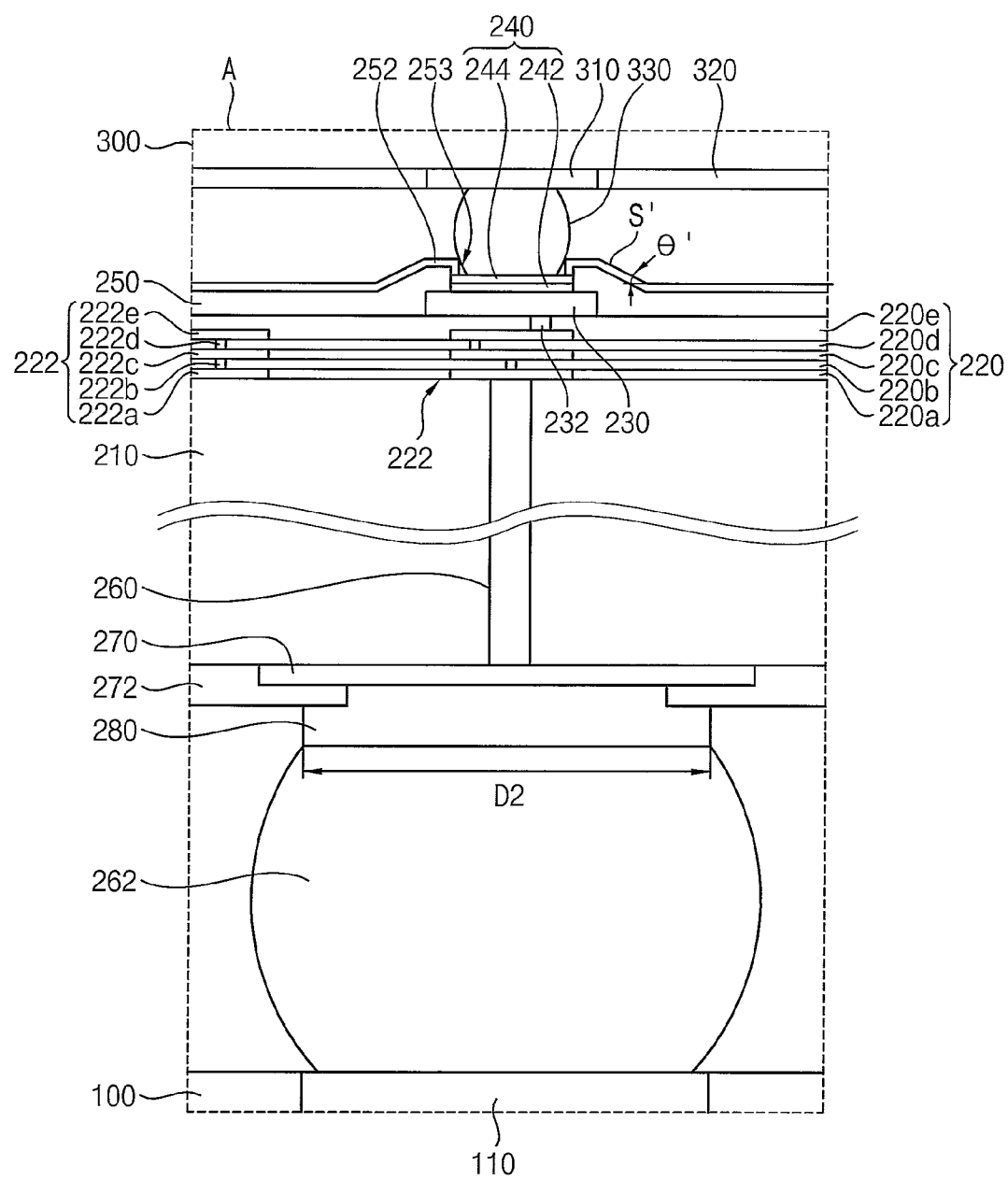
FIG. 16 is a cross-sectional view illustrating a semiconductor package in accordance with exemplary embodiments of the present disclosure.

FIG. 16 is a cross-sectional view illustrating a semiconductor package in accordance with exemplary embodiments of the present disclosure. The semiconductor package may be substantially the same as or similar to the semiconductor package described with reference to FIGS. 1 to 3 except for a configuration of a pad structure. Thus, same reference numerals will be used to refer to the same or like elements. To the extent that a detailed description of one or more elements has been omitted, it may be assumed that these elements are at least similar to corresponding elements that have been described elsewhere in the specification.

Referring to FIG. 16, an interposer of a semiconductor package may include a pad structure disposed on a wiring layer 220. The pad structure may include a first redistribution wiring pad 230 disposed on the wiring layer 220, a first insulation layer pattern 250 disposed on the first redistribution wiring pad 230 and having a first opening 251 which exposes a middle portion of the first redistribution wiring pad 230, a first bonding pad 240 disposed on the first redistribution wiring pad 230 within the first opening 251 of the first insulation layer pattern 250, and a buffer layer 252 disposed on the first insulation layer pattern 250 and having a second opening 253 which exposes a portion of the first bonding pad 240.

In exemplary embodiments of the present disclosure, the buffer layer 252 may be formed on the wiring layer 220 and may cover the first insulation layer pattern 250 and the first bonding pad 240. For example, the buffer layer 252 may include a polymer such as RDL buffered coating layer (RBC). The buffer layer 252 may be a polymer layer formed by a spin coating process or a spray process.

The buffer layer 252 may have a second inclined surface S' extending downward in an outward direction from a periphery of the first bonding pad 240, for example, a periphery of a top portion of the first insulation layer pattern 250. The second inclined surface S' may extend at an angle θ' with respect to the surface of the wiring layer 220. For example, the second inclined surface S' may have the angle the same as or similar to the angle of the first inclined surface S. The second inclined surface S' may be within a range of 40 degrees to 60 degrees with respect to the surface of the wiring layer 220.

The buffer layer 252 may be disposed on a peripheral region of the first bonding pad 240. A height of the first bonding pad 240 may be less than a height of the buffer layer 252. Accordingly, the first bonding pad 240 may be disposed in a concave shape inside the first and second openings 251, 253 of the first insulation layer pattern 250 and the buffer layer 252. Thus, the pad structure disposed on the wiring layer 220 of the interposer may have an intaglio structure.

Hereinafter, a method of manufacturing the semiconductor package in FIG. 16 will be explained.

Figure 17:
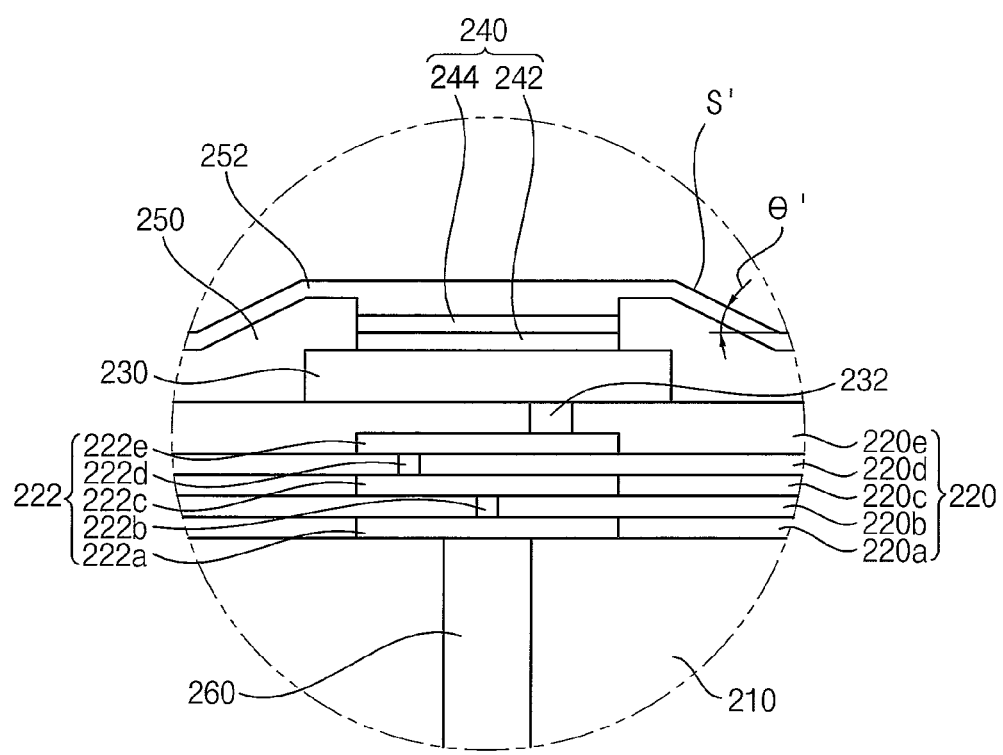
FIGS. 17 to 19 are cross-sectional views illustrating a method of manufacturing a semiconductor package in accordance with exemplary embodiments of the present disclosure.
Figure 18:
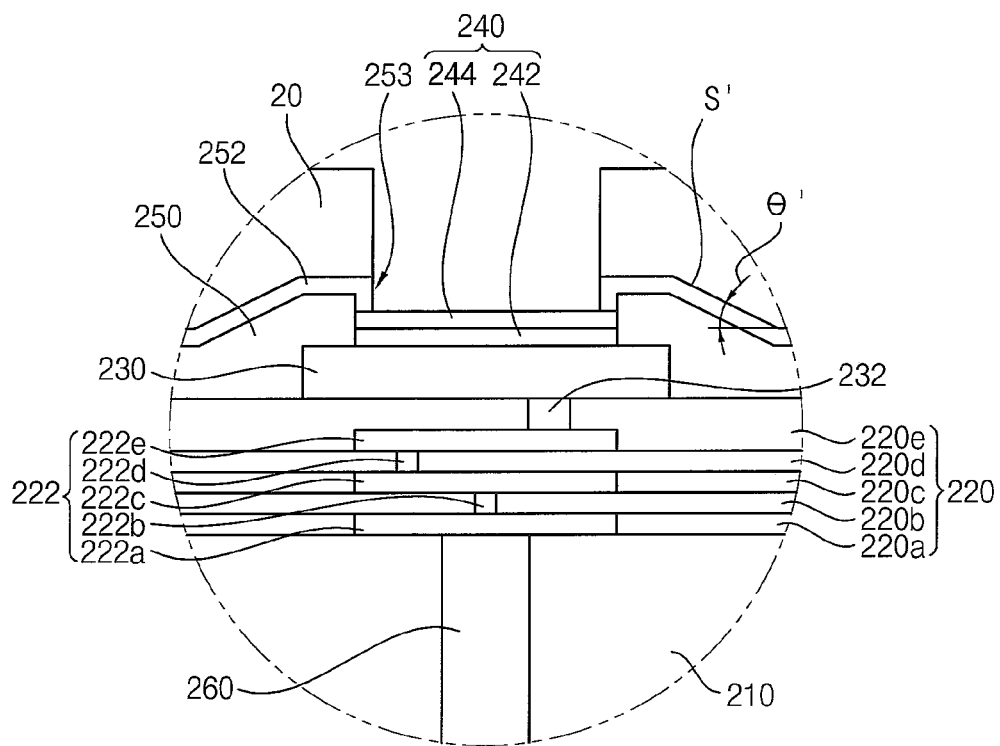
Figure 19:
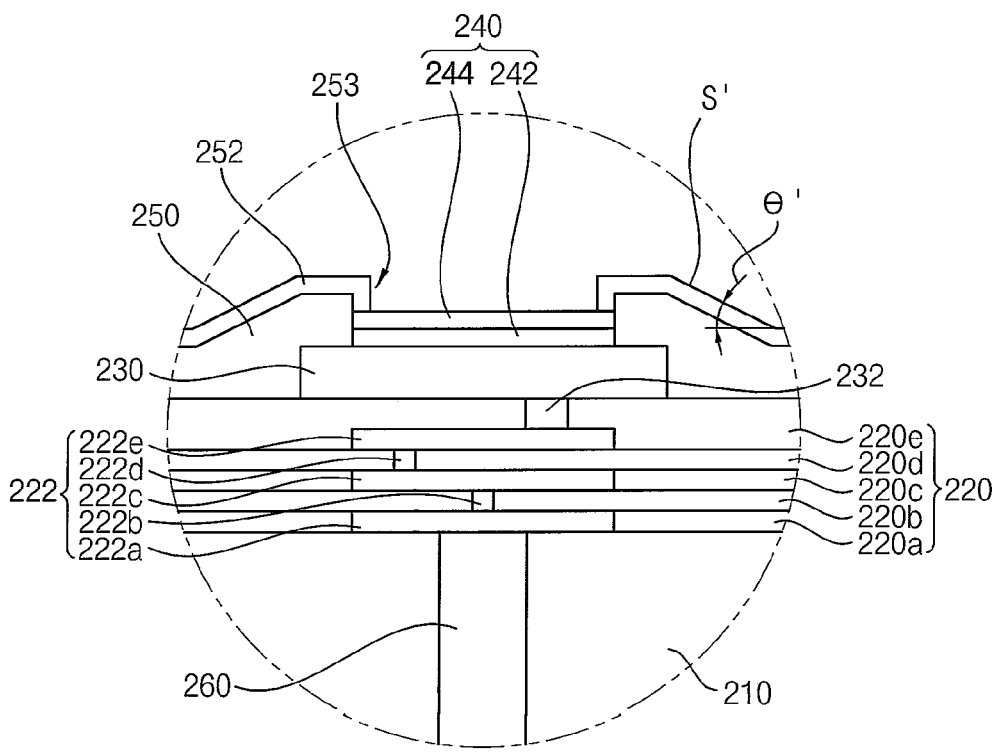

FIGS. 17 to 19 are cross-sectional views illustrating a method of manufacturing a semiconductor package in accordance with exemplary embodiments of the present disclosure.

Referring to FIG. 17, processes that are the same as or similar to the processes described with reference to FIGS. 4 to 8 may be performed to form a first redistribution wiring pad 230, a first bonding pad 240 and a first insulation layer pattern 250 on a wiring layer 220, and then, a buffer layer 252 may be formed on the first insulation layer pattern 250.

In exemplary embodiments of the present disclosure, the buffer layer 252 may be formed on the wiring layer 220 and may cover the first insulation layer pattern 250 and the first bonding pad 240. For example, the buffer layer 252 may include a polymer such as RDL buffered coating layer (RBC). The buffer layer 252 may be a polymer layer formed by a spin coating process or a spray process.

The buffer layer 252 may have a second inclined surface S' extending downward in an outward direction from a periphery of the first bonding pad 240, for example, a periphery of a top portion of the first insulation layer pattern 250. The second inclined surface S' may extend at an angle θ' with respect to the surface of the wiring layer 220. For example, the second inclined surface S' may have the angle the same as or similar to the angle of the first inclined surface S. The second inclined surface S' may be within a range of 40 degrees to 60 degrees with respect to the surface of the wiring layer 220.

Referring to FIGS. 18 and 19, a photoresist pattern 20 may be formed on the buffer layer 252 and may have an opening which exposes at least a portion of the first bonding pad 240, and then, the exposed portion of the buffer layer 252 may be removed using the photoresist pattern 20 as a mask and may expose a portion of an upper surface of the first bonding pad 240.

For example, after a photoresist layer is formed on the wiring layer 220 that covers the buffer layer 252, an exposure process may be performed on the photoresist layer to form the photoresist pattern 20 having the opening which exposes a region of the buffer layer 252. Then, the exposed portion of the buffer layer 252 may be removed using the photoresist pattern 20 as an etching mask to form a second opening 253 which exposes a portion of the first bonding pad 240. Then, the photoresist pattern 20 may be removed.

Then, processes the same as or similar to the processes described with reference to FIGS. 9 to 11 may be performed to form an interposer 200 having a pad structure on the wiring layer 220. The pad structure may include the first redistribution wiring pad 230 on the wiring layer 220, the first insulation layer pattern 250 on the first redistribution wiring pad 230 and having a first opening 251 which exposes a middle portion of the first redistribution wiring pad 230, the first bonding pad 240 on the first redistribution wiring pad 230 within the first opening 251 of the first insulation layer pattern 250, and the buffer layer 252 on the first insulation layer pattern 250 and having a second opening 253 which exposes a portion of the first bonding pad 240.

Thus, since the pad structure has an intaglio structure, contamination may be prevented from remaining on the pad structure during a bonding process of the interposer.

Figure 20:
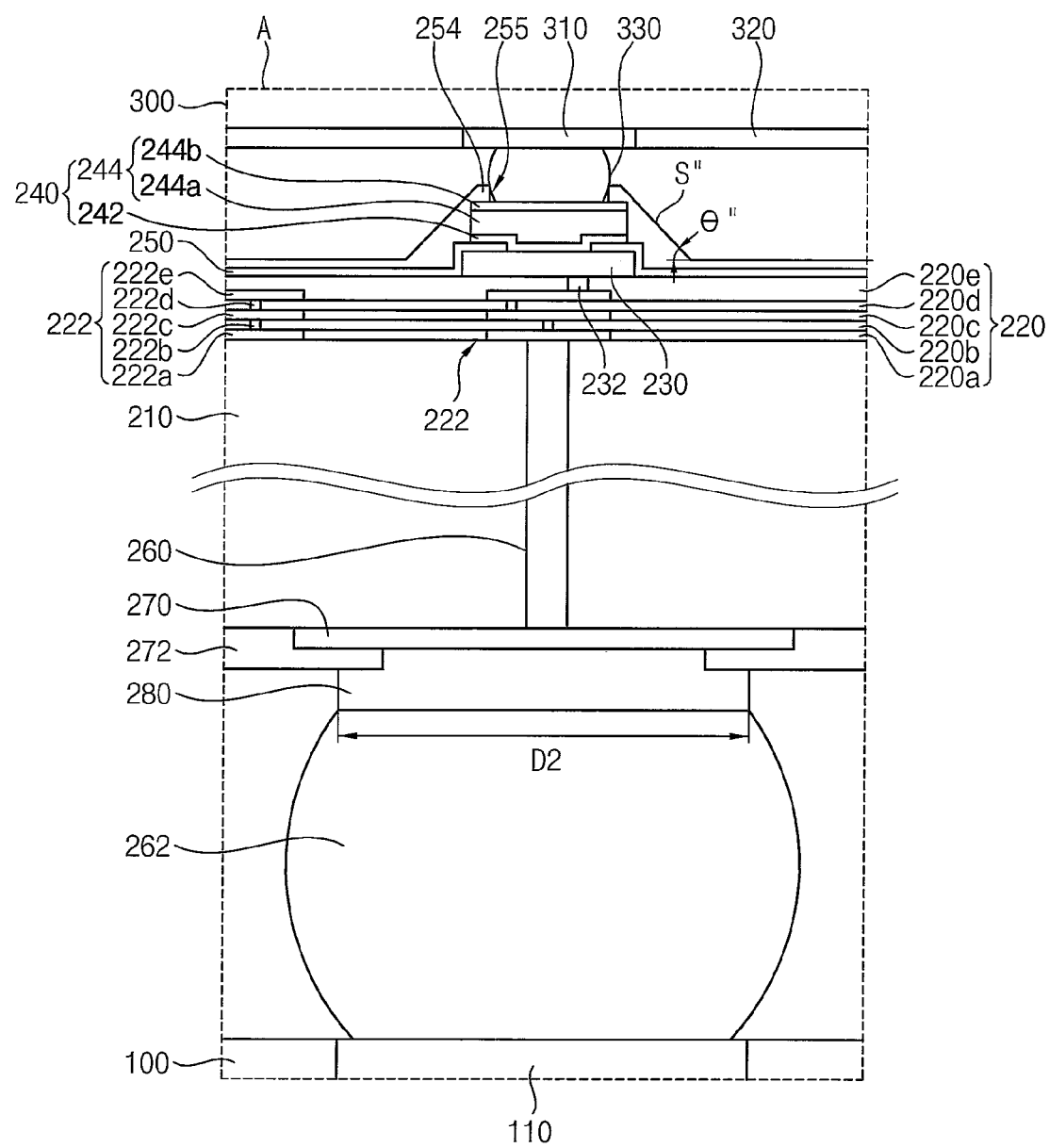
FIG. 20 is a cross-sectional view illustrating a semiconductor package in accordance with exemplary embodiments of the present disclosure.

FIG. 20 is a cross-sectional view illustrating a semiconductor package in accordance with exemplary embodiments of the present disclosure. The semiconductor package may be substantially the same as or similar to the semiconductor package described with reference to FIGS. 1 to 3 except for a configuration of a pad structure. Thus, same reference numerals will be used to refer to the same or like elements. To the extent that a detailed description of one or more elements has been omitted, it may be assumed that these elements are at least similar to corresponding elements that have been described elsewhere in the specification.

Referring to FIG. 20, an interposer of a semiconductor package may include a pad structure disposed on a wiring layer 220. The pad structure may include a first redistribution wiring pad 230 on the wiring layer 220, a first insulation layer pattern 250 on the first redistribution wiring pad 230 and having a first opening 251 which exposes a middle portion of the first redistribution wiring pad 230, a first bonding pad 240 on the first redistribution wiring pad 230, and a third insulation layer pattern 254 on the first insulation layer pattern 250 and having a third opening 255 which exposes a portion of the first bonding pad 240.

In exemplary embodiments of the present disclosure, the first insulation layer pattern 250 may serve as a first passivation layer covering the wiring layer 220. The third insulation layer pattern 254 may serve as a second passivation layer covering the first insulation layer pattern 250.

The first bonding pad 240 may be disposed on the first redistribution wiring pad 230 and the first insulation layer pattern 250 covering a peripheral region of the first redistribution wiring pad 230. The first bonding pad 240 may contact an upper surface of the first redistribution wiring pad 230 exposed by the first insulation layer pattern 250. The first bonding pad 240 may include a seed layer pattern 242 on the first redistribution wiring pad 230 and a plating layer pattern 244 on the seed layer pattern 242.

The third insulation layer pattern 254 may be formed on the wiring layer 220 and may cover the first insulation layer pattern 250 and the first bonding pad 240. For example, the third insulation layer pattern 254 may include a polymer such as RDL buffered coating layer (RBC).

The third insulation layer pattern 254 may have a third inclined surface S" extending downward in an outward direction from a periphery of the first bonding pad 240. The third inclined surface S" may extend at an angle θ" with respect to the surface of the wiring layer 220. For example, the third inclined surface S" may be within a range of 40 degrees to 60 degrees with respect to the surface of the wiring layer 220.

The third insulation layer pattern 254 may be disposed on a peripheral region of the first bonding pad 240. A height of the first bonding pad 240 may be less than a height of the third insulation layer pattern 254. Accordingly, the first bonding pad 240 may be disposed in a concave shape inside the third opening 255 of the third insulation layer pattern 254. Thus, the pad structure disposed on the wiring layer 220 of the interposer may have an intaglio structure.

Hereinafter, a method of manufacturing the semiconductor package in FIG. 20 will be explained.

FIGS. 21 to 27 are cross-sectional views illustrating a method of manufacturing a semiconductor package in accordance with exemplary embodiments of the present disclosure.

Figure 21:
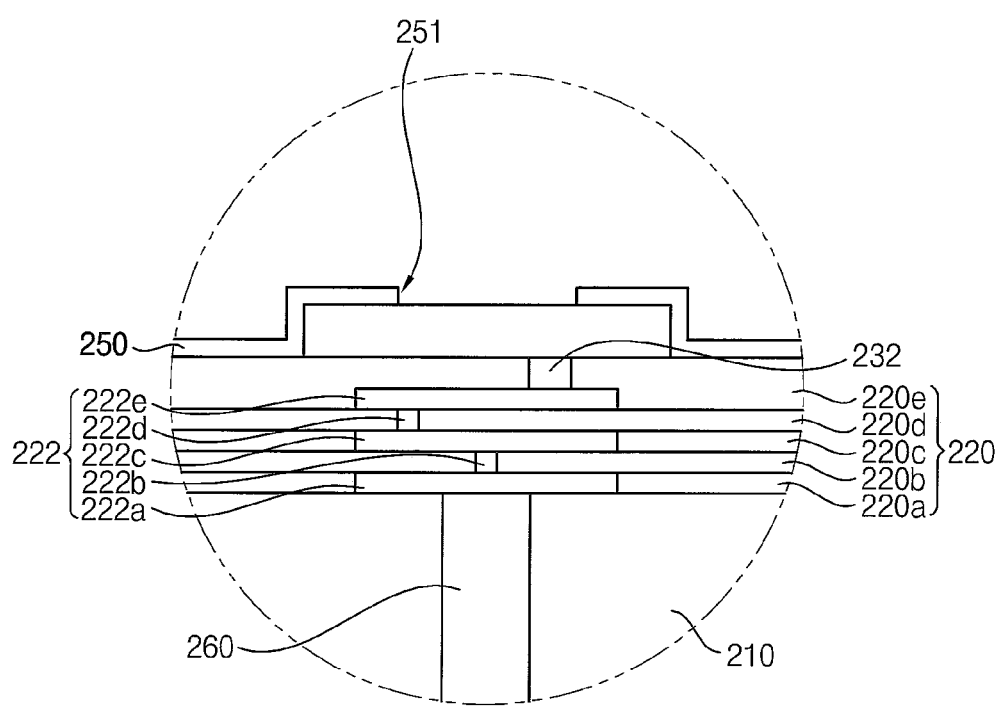
FIGS. 21 to 27 are cross-sectional views illustrating a method of manufacturing a semiconductor package in accordance with exemplary embodiments of the present disclosure.

Referring to FIG. 21, first, processes the same as or similar to the processes described with reference to FIGS. 4 and 5 may be performed to form a first redistribution wiring pad 230 on a wiring layer 220, and then, a first insulation layer pattern 250 may be formed that exposes a portion of the first redistribution wiring pad 230. The first insulation layer pattern 250 may serve as a first passivation layer covering the wiring layer 220.

In exemplary embodiments of the present disclosure, the first insulation layer pattern 250 may be formed on the wiring layer 220 and may have a first opening 251 which exposes a middle portion of the first redistribution wiring pad 230.

For example, a first insulation layer may be formed on the wiring layer 220 and may cover the first redistribution wiring pad 230. For example, the first insulation layer may include oxide, nitride, etc. Additionally, the first insulation layer may be formed by a chemical vapor deposition (CVD) process, a plasma enhanced chemical vapor deposition (PECVD) process, an atomic layer deposition (ALD) process, a lower pressure chemical vapor deposition (LPCVD) process, a sputtering process, etc.

Then, a photoresist pattern may be formed on the first insulation layer to form an opening which exposes at least a portion of the first redistribution wiring pad 230, and then, the exposed portion of the first insulation layer may be removed using the photoresist pattern as a mask to form the first opening 251 which exposes a portion of an upper surface of the first redistribution wiring pad 230.

Referring to FIGS. 22 to 25, a first bonding pad 240 may be formed on the first redistribution wiring pad 230.

Figure 22:
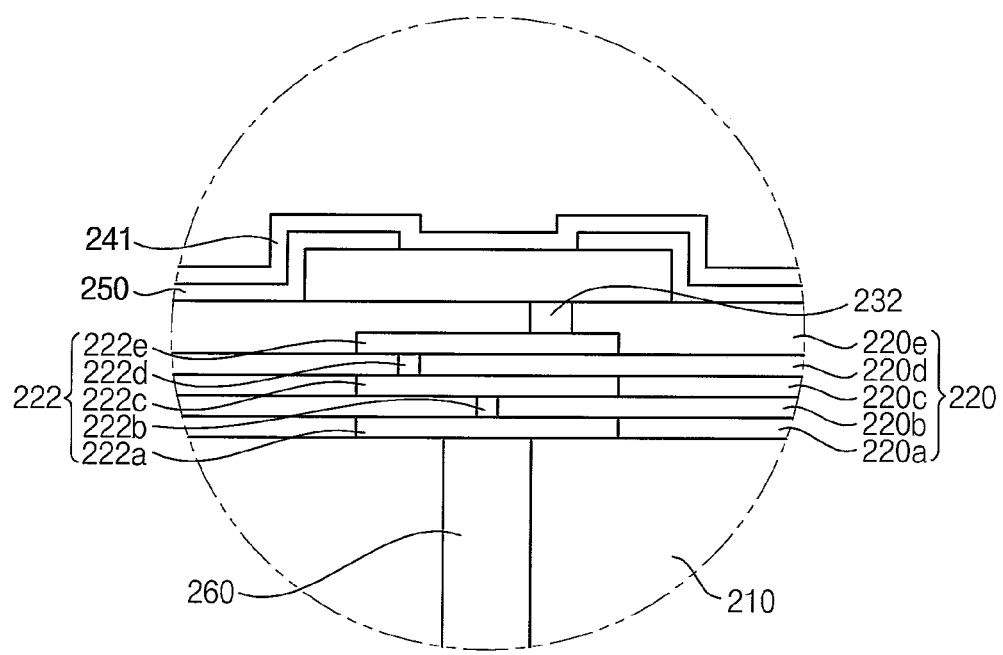

As illustrated in FIG. 22, a seed layer 241 may be formed on the first redistribution wiring pad 230. The seed layer 241 may include an alloy layer including titanium/copper (Ti/Cu), titanium/palladium (Ti/Pd), titanium/nickel (Ti/Ni), chromium/copper (Cr/Cu) or a combination thereof. The seed layer 241 may be formed by a sputtering process.

Figure 23:
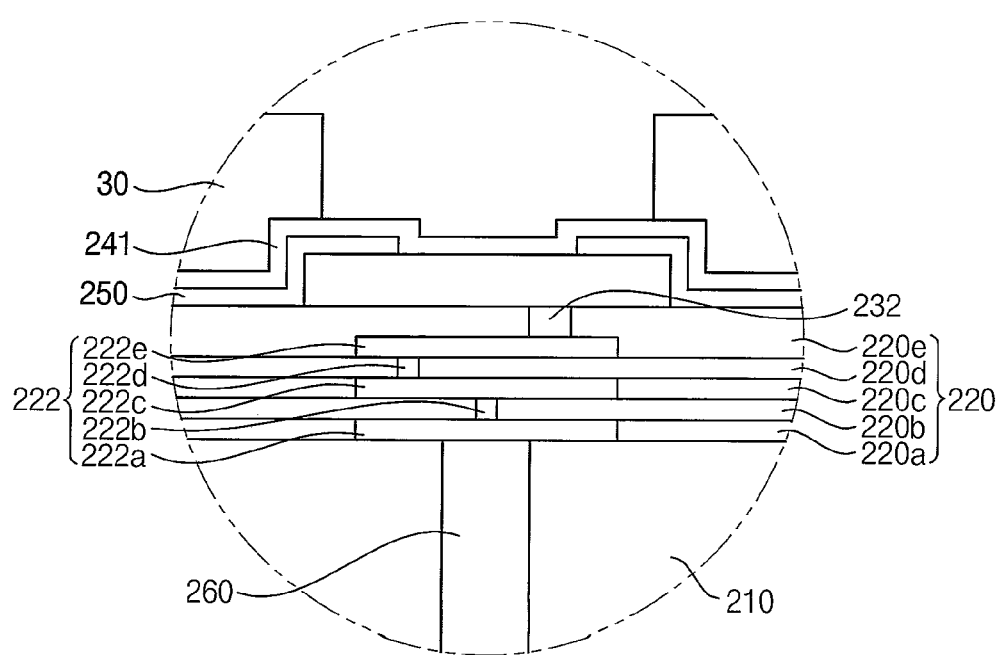

As illustrated in FIG. 23, a photoresist pattern 30 may be formed on the wiring layer 220 and may have an opening which exposes a region of the seed layer 241 on the first redistribution wiring pad 230.

A photoresist layer may be formed on the wiring layer 220 and may cover the first redistribution wiring pad 230, and then, an exposure process may be performed on the photoresist layer to form the photoresist pattern 30 having the opening which exposes the region of the seed layer 241 on the first redistribution wiring pad 230.

Figure 24:
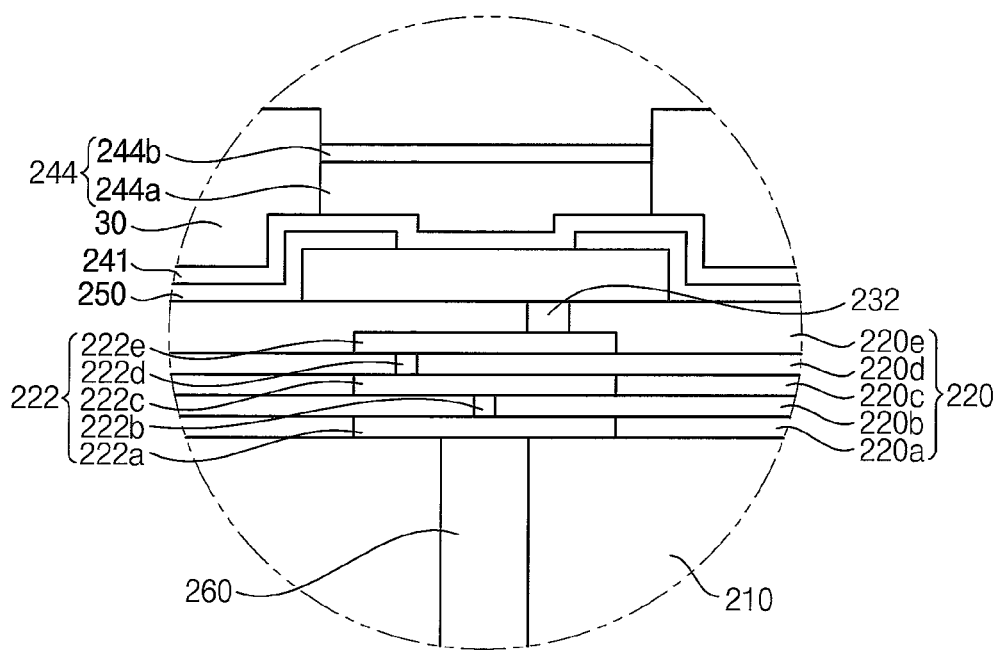

As illustrated in FIG. 24, a plating layer pattern 244 may be formed on the region of the seed layer 241 exposed by the photoresist pattern 30. The plating layer pattern 244 may be positioned within the upper surface of the first redistribution wiring pad 230.

In exemplary embodiments of the present disclosure, the plating layer pattern 244 may include a first plating layer pattern 244a and a second plating layer pattern 244b on the first plating layer pattern 244a. For example, a first plating process may be performed to form the first plating layer pattern 244a on the exposed region of the seed layer 241, and a second plating process may be performed to form the second plating layer pattern 244b on the first plating layer pattern 244a.

For example, the first plating layer pattern 244a may include nickel (Ni) and the second plating layer pattern 244b may include gold (Au).

Figure 25:
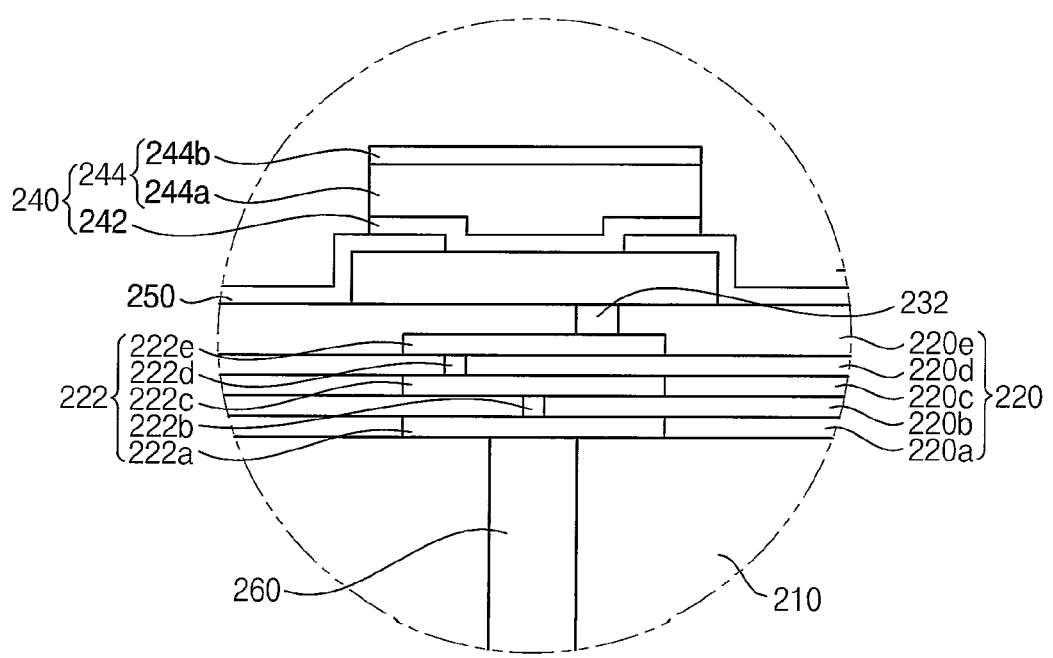

As illustrated in FIG. 25, the photoresist pattern 30 and a portion of the seed layer 241 may be removed to form a seed layer pattern 242. Thus, the first bonding pad 240 including the seed layer pattern 242 and the plating layer pattern 244 may be formed on the first redistribution wiring pad 230.

Figure 26:
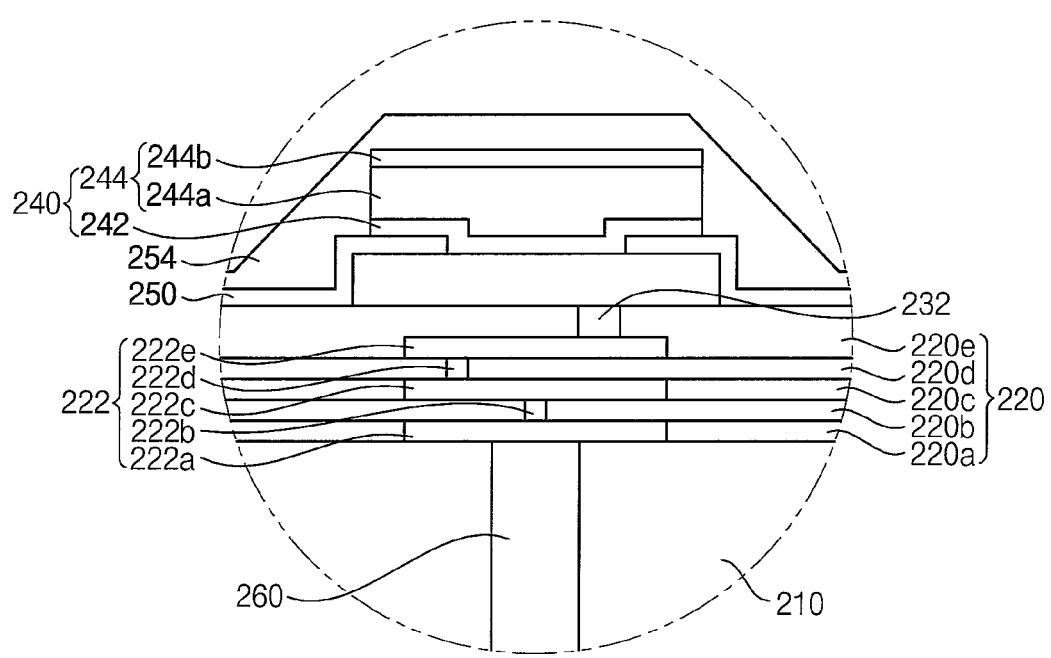
Figure 27:
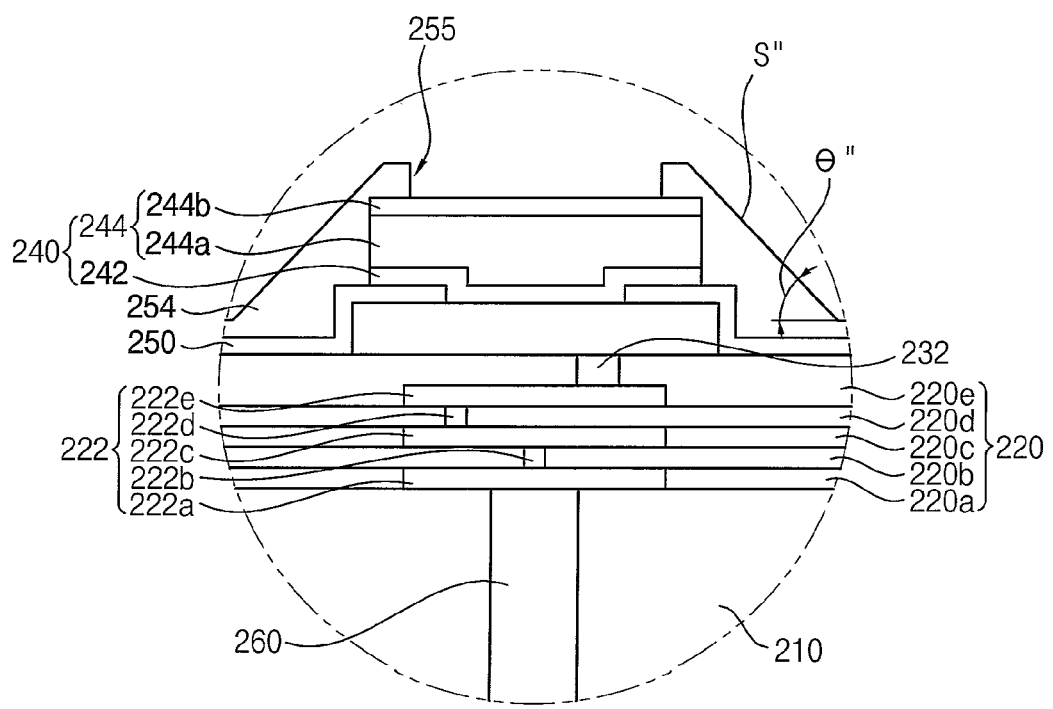

Referring to FIGS. 26 and 27, a third insulation layer pattern 254 may be formed on the first insulation layer pattern 250. The third insulation layer pattern 254 may serve as a second passivation layer covering the first passivation layer.

For example, an insulation layer may be formed on the first insulation layer pattern 250 and may cover the first bonding pad 240, and a portion of the insulation layer may be removed to form the third insulation layer pattern 254 having a third opening 255 which exposes a portion of an upper surface of the first bonding pad 240.

For example, the third insulation layer pattern 254 may include a polymer such as RDL buffered coating layer (RBC). The third insulation layer pattern 254 may be a polymer layer formed by a spin coating process or a spray process.

Thus, the insulation layer pattern may be formed on the wiring layer 220 and may expose the portion of the first bonding pad 240. Here, the insulation layer pattern may include the first insulation layer pattern 250 formed on the wiring layer 220 as the first passivation layer exposing the portion of the first redistribution wiring pad 230 and the third insulation layer pattern 254 formed on the first insulation layer pattern 250 as the second passivation layer exposing the portion of the first bonding pad 240.

The third insulation layer pattern 254 may have a third inclined surface S" extending downward in an outward direction from a periphery of the first bonding pad 240. The third inclined surface S" may extend at an angle θ" with respect to the surface of the wiring layer 220. For example, the angle of the third inclined surface S" may be within a range of 40 degrees to 60 degrees with respect to the surface of the wiring layer 220.

Thus, the pad structure having an intaglio structure may be formed on the wiring layer 220.

Figure 28:
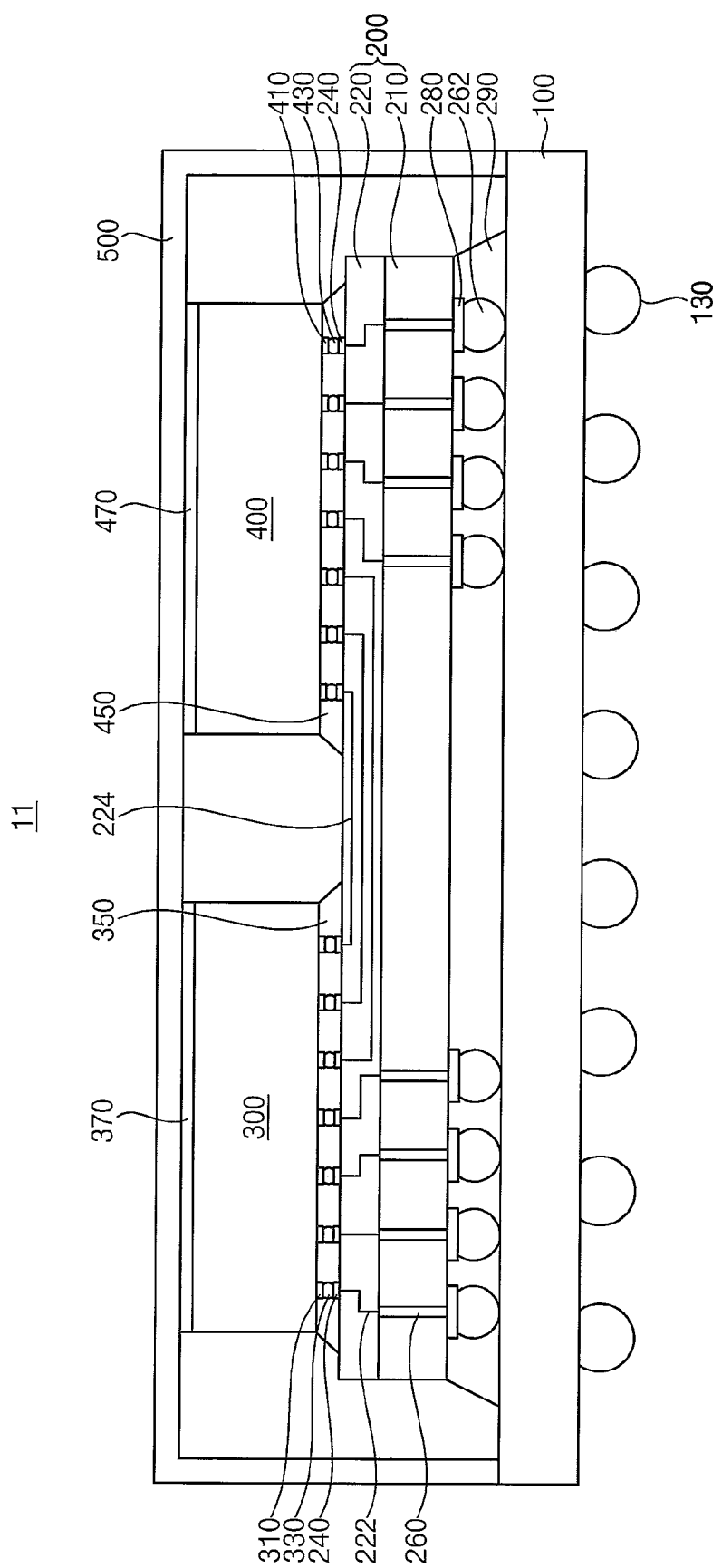
FIG. 28 is a cross-sectional view illustrating a semiconductor package in accordance with exemplary embodiments of the present disclosure.

FIG. 28 is a cross-sectional view illustrating a semiconductor package in accordance with exemplary embodiments of the present disclosure. The semiconductor package may be substantially the same as or similar to the semiconductor package described with reference to FIGS. 1 to 3 except for an additional heat sink. Thus, same reference numerals will be used to refer to the same or like elements. To the extent that a detailed description of one or more elements has been omitted, it may be assumed that these elements are at least similar to corresponding elements that have been described elsewhere in the specification.

Referring to FIG. 28, a semiconductor package 11 may include a package substrate 100, an interposer 200, a first semiconductor device 300, a second semiconductor device 400 and a heat sink 500.

In exemplary embodiments of the present disclosure, the heat sink 500 may be disposed on the package substrate 100 and may cover the first semiconductor device 300 and the second semiconductor device 400. The heat sink 500 may have a planar area corresponding to that of the package substrate 100.

The heat sink 500 may include a first thermal conductive plate covering the first and second semiconductor devices 300, 400 and a second thermal conductive plate at least partially surrounding the first and second semiconductor devices 300, 400. Here, a molding member may be disposed between the first and second semiconductor devices 300, 400 and the second thermal conductive plate. For example, the first and second thermal conductive plates may include aluminum or aluminum alloy.

A first thermal interface material (TIM) 370 may be disposed between the first semiconductor device 300 and the first thermal conductive plate, and a second thermal interface material (TIM) 470 may be disposed between the second semiconductor device 400 and the first thermal conductive plate. Accordingly, the heat sink 500 may be thermally connected to the first semiconductor device 300 through the first thermal interface material 370, and the heat sink 500 may be thermally connected to the second semiconductor device 400 through the second thermal interface material 470.

The semiconductor package may include semiconductor devices such as logic devices or memory devices. The semiconductor package may include logic devices such as central processing units (CPUs), main processing units (MPUs), or application processors (APs), or the like, and volatile memory devices such as dynamic random-access memory (DRAM) devices, HBM devices, or non-volatile memory devices such as flash memory devices, parameter random-access memory (PRAM) devices, magnetoresistive random-access memory (MRAM) devices, ReRAM devices, or the like.

The foregoing is illustrative of exemplary embodiments of the present disclosure and is not to be construed as limiting thereof. Although a few exemplary embodiments of the present disclosure have been described, those skilled in the art will readily appreciate that many modifications are possible in exemplary embodiments of the present disclosure without materially departing from the novel teachings and aspects of the present invention. Accordingly, all such modifications are intended to be included within the scope of exemplary embodiments of the present disclosure as defined in the claims.

What is claimed is:

1. A semiconductor package, comprising:
   a package substrate;
   an interposer disposed on the package substrate, the interposer including a semiconductor substrate, a wiring layer disposed on an upper surface of the semiconductor substrate and having a plurality of wirings disposed therein, redistribution wiring pads disposed on the wiring layer and electrically connected to the plurality of wirings, bonding pads disposed on the redistribution wiring pads, and an insulation layer pattern disposed on the wiring layer and exposing at least portions of the bonding pads; and
   first and second semiconductor devices each disposed on the interposer,
   wherein the first and second semiconductor devices are spaced apart from each other and are electrically connected to each other by at least one of the plurality of wirings,
   wherein the insulation layer pattern includes:
      a first passivation layer disposed on the wiring layer, the first passivation layer exposing portions of the redistribution wiring pads; and
      a second passivation layer disposed on the first passivation layer and exposing portions of the bonding pads, and
   wherein the second passivation layer includes an inclined surface extending downward direction from a periphery of each bonding pad and rising above a top surface of each bonding pad.

2. The semiconductor package of claim 1, wherein the first and second semiconductor devices are each mounted on the interposer via conductive bumps disposed on the bonding pads.

3. The semiconductor package of claim 1, wherein the first passivation layer includes an opening which exposes a middle portion of each of the redistribution wiring pads.

4. The semiconductor package of claim 3, wherein each of the bonding pads contacts an upper surface of each of the redistribution wiring pads exposed by the first passivation layer.

5. The semiconductor package of claim 3, wherein the second passivation layer includes an opening which exposes the portion of the bonding pad.

6. The semiconductor package of claim 1, wherein the second passivation layer includes a polymer material.

7. The semiconductor package of claim 1, wherein the inclined surface extends at an angle with respect to a surface of the wiring layer, and the inclined surface is within a range of 40 degrees to 60 degrees with respect to the surface of the wiring layer.

8. The semiconductor package of claim 1, wherein a height of the bonding pad is less than a height of the second passivation layer.

9. The semiconductor package of claim 1, wherein the second passivation layer is disposed on a peripheral region of each of the bonding pads.

10. The semiconductor package of claim 1, wherein the semiconductor substrate further include a plurality of through electrodes, each of which penetrate through the semiconductor substrate and electrically connect the first and second semiconductor devices to the package substrate.

11. A semiconductor package, comprising:
   an interconnection substrate; and
   at least one semiconductor device disposed on the interconnection substrate,
   wherein the interconnection substrate includes:
      a semiconductor substrate having a plurality of through electrodes penetrating therethrough;
      a wiring layer disposed on an upper surface of the semiconductor substrate and having a plurality of wirings electrically connected to the plurality of through electrodes;
      redistribution wiring pads disposed on the wiring layer and electrically connected to the plurality of wirings;
      first bonding pads disposed on the first redistribution wiring pads; and
      an insulation layer pattern disposed on the wiring layer and exposing at least portions of the first bonding pads, and wherein the insulation layer pattern includes:
- a first passivation layer disposed on the wiring layer, the first passivation layer exposing portions of the redistribution wiring pads; and
- a second passivation layer disposed on the first passivation layer and exposing portions of the bonding pads.

12. The semiconductor package of claim 11, the first passivation layer includes an opening which exposes a middle portion of each of the redistribution wiring pads.

13. The semiconductor package of claim 12, wherein each of the bonding pads contacts an upper surface of each of the redistribution wiring pads exposed by the first passivation layer.

14. The semiconductor package of claim 12, wherein the second passivation layer includes an opening which exposes the portion of the bonding pad.

15. The semiconductor package of claim 11, wherein the second passivation layer includes a polymer material.

16. The semiconductor package of claim 11, wherein the second passivation layer includes an inclined surface extending downward direction from a periphery of each bonding pad and rising above a top surface of each bonding pad.

17. The semiconductor package of claim 16, wherein the inclined surface extends at an angle with respect to a surface of the wiring layer, and the inclined surface is within a range of 40 degrees to 60 degrees with respect to the surface of the wiring layer.

18. The semiconductor package of claim 11, further comprising:
- second redistribution wiring pads disposed on a lower surface of the semiconductor substrate and electrically connected to the through electrodes; and
- second bonding pads disposed on the second redistribution wiring pads.

19. The semiconductor package of claim 11, wherein the second passivation layer includes a polymer material.

20. The semiconductor package of claim 11, wherein the at least one semiconductor device is mounted on the interconnection substrate via conductive bumps disposed on the first bonding pads.

* * * * *